(12) United States Patent
Kawano et al.

(10) Patent No.: US 7,633,167 B2
(45) Date of Patent: Dec. 15, 2009

(54) SEMICONDUCTOR DEVICE AND METHOD FOR MANUFACTURING SAME

(75) Inventors: Masaya Kawano, Kanagawa (JP); Koji Soejima, Kanagawa (JP); Nobuaki Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 49 days.

(21) Appl. No.: 11/528,655

(22) Filed: Sep. 28, 2006

(65) Prior Publication Data

US 2007/0069364 A1   Mar. 29, 2007

(30) Foreign Application Priority Data

Sep. 29, 2005   (JP)   ............... 2005-284248

(51) Int. Cl.
*H01L 23/48*   (2006.01)
*H01L 23/52*   (2006.01)

(52) U.S. Cl. ............... 257/774; 257/758; 257/E23.011
(58) Field of Classification Search ............... 257/774, 257/758, E23.011
See application file for complete search history.

(56) References Cited

U.S. PATENT DOCUMENTS

| 5,229,647 | A | * | 7/1993 | Gnadinger | ............... | 257/785 |
|---|---|---|---|---|---|---|
| 5,814,889 | A | * | 9/1998 | Gaul | ............... | 257/773 |
| 6,184,060 | B1 | * | 2/2001 | Siniaguine | ............... | 438/106 |
| 6,844,241 | B2 | * | 1/2005 | Halahan et al. | ............... | 438/454 |
| 6,897,148 | B2 | * | 5/2005 | Halahan et al. | ............... | 438/678 |
| 2001/0010991 | A1 | * | 8/2001 | Moradi et al. | ............... | 445/24 |
| 2003/0160325 | A1 | * | 8/2003 | Yoneda et al. | ............... | 257/758 |
| 2004/0061238 | A1 | * | 4/2004 | Sekine | ............... | 257/774 |
| 2006/0006503 | A1 | * | 1/2006 | Farnworth | ............... | 257/642 |

FOREIGN PATENT DOCUMENTS

| JP | 60-140850 | | 7/1985 | | |
|---|---|---|---|---|---|
| WO | WO03065450 | A2 * | 8/2003 | ............ | 257/E23.011 |

* cited by examiner

*Primary Examiner*—Nitin Parekh
(74) *Attorney, Agent, or Firm*—Young & Thompson

(57) ABSTRACT

A falling off of a through electrode is inhibited without decreasing a reliability of a semiconductor device including a through electrode. A semiconductor device 100 includes: a silicon substrate 101; a through electrode 129 extending through the silicon substrate 101; and a first insulating ring 130 provided in a circumference of a side surface of the through electrode 129 and extending through the semiconductor substrate 101. In addition, the semiconductor device 100 also includes a protruding portion 146, being provided at least in the vicinity of a back surface of a device-forming surface of the semiconductor substrate 101 so as to contact with the through electrode 129, and protruding in a direction along the surface of the semiconductor substrate 101 toward an interior of the through electrode 129.

18 Claims, 29 Drawing Sheets

SEMICONDUCTOR DEVICE AND METHOD FOR MANUFACTURING SAME

This application is based on Japanese patent application No. 2005-284,248, the content of which is incorporated hereinto by reference.

BACKGROUND

1. Technical Field

The present invention relates to a semiconductor device and a method for manufacturing thereof.

2. Related Art

In recent years, lighter, more compact and more sophisticated semiconductor devices are generally required in the industry, a dense installation of interconnects, a miniaturization of a logical device and an increased capacity of a memory are proceeded in semiconductor devices such as a multi-chip package.

A solution for such requirements is an attempt for achieving a dense installation of interconnects by providing a through electrode in a semiconductor substrate. Typical conventional through electrode is described in Japanese Patent Laid-Open No. S60-140,850 (1985). A device is described in Japanese Patent Laid-Open No. S60-140,850, in which an aperture is provided in a substrate, and a back surface bump for contacting with a through electrode is provided in the aperture in the lower portion of the through electrode composed of a polycrystalline silicon film.

SUMMARY OF THE INVENTION

In the meantime, the present inventors have investigated a semiconductor device having a through electrode, and found that, in the side of the back surface of the semiconductor substrate, a through electrode may often fall off from the inside of the semiconductor substrate and eventually dropped off therefrom. Therefore, further investigations have been eagerly conducted for the purpose of preventing the through electrode from falling off from the substrate.

Here, a possible solution for inhibiting the falling off of the through electrode may be an extension of the through electrode across a device-forming surface of the semiconductor substrate. This solution corresponds to a configuration described in Japanese Patent Laid-Open No. S60-140,850. Nevertheless, according to the configuration described in the above-described Japanese Patent Laid-Open No. S60-140,850, a larger aperture for forming a bump is additionally provided in a periphery of the through electrode. Consequently, it is difficult to achieve closely packing of the through electrodes.

Further, a polycrystalline silicon film composing the through electrode is formed over a device-forming surface in the technology described in Japanese Patent Laid-Open No. S60-140,850, an operation for forming the through electrode from the side of the device-forming surface is required. In such case, when a procedure of forming the through electrode before forming the device is employed, better heat resistance is required for a material for forming the electrode, and thus a range of choice for the electrode material may often be limited. Further, when a procedure of forming the through electrode after forming the device is employed, there is a concern that a reliability of the device is reduced. Further, when the silicon is etched from the back surface thereof or when a bump is formed in the back surface thereof, an issue of a metal contamination is caused, and this may lead to a deterioration of the performance of the device.

According to one aspect of the present invention, there is provided a semiconductor device, comprising: a semiconductor substrate, a through electrode extending through the semiconductor substrate; an annular cylindrical insulating film, being provided in a circumference of a side surface of the through electrode and extending through the semiconductor substrate; and a protruding portion, being provided at least in the vicinity of a back surface of a device-forming surface of the semiconductor substrate so as to contact with the through electrode, and protruding in a direction along the surface of the semiconductor substrate toward an interior of the through electrode.

In the semiconductor device according to the above-described aspect of the present invention, the protruding portion protruding in the direction along the surface of the semiconductor substrate toward the interior of the through electrode is provided in the vicinity of the back surface of the semiconductor substrate, and the protruding portion is in contact with the through electrode. Consequently, the through electrode is supported by the protruding portion in the side of the back surface of the semiconductor substrate, so that the falling off of the through electrode from the substrate can be avoided. Further, the semiconductor device according to the above-described aspect of the present invention is configured to be provided with the through electrode, which can be manufactured from the side of the back surface. Consequently, according to the aspect of the present invention, a falling off of the through electrode from the side of the back surface can be effectively prevented without decreasing a reliability of the semiconductor device.

In addition, since the annular cylindrical insulating film is provided in the periphery of the through electrode in the semiconductor device according to the above-described aspect of the present invention, an electrical insulation can be provided in the periphery of the through electrode and a parasitic capacitance can be reduced. In addition, since the electrical insulation is ensured in the periphery of the through electrode, a closely packing of the through electrodes can be achieved.

According to another aspect of the present invention, there is provided a method for manufacturing a semiconductor device, comprising: forming an annular cylindrical insulating film, by selectively removing the semiconductor substrate from a side of a device-forming surface of the semiconductor substrate to form an annular cylindrical concave portion, then filling an insulating film in an interior of the annular cylindrical concave portion and removing portions of the insulating film located outside of the annular cylindrical concave portion; forming a predetermined semiconductor device in the device-forming surface; reducing a thickness of the semiconductor substrate from a reverse side of the device-forming surface, after the forming the semiconductor device; providing an aperture, by providing a back surface insulating film on the back surface and selectively removing a predetermined region of the back surface insulating film, after the reducing the thickness of the semiconductor substrate; forming a hole and forming a protruding portion, by selectively removing a predetermined region of the semiconductor substrate remaining in the inside of the annular cylindrical insulating film through a mask of the aperture from side of the back surface to form the hole, and utilizing a portion of the back surface insulating film that protrudes in a direction along the surface of the semiconductor substrate as the protruding portion, the hole including a region having larger diameter than the diameter of the aperture and extending through the semiconductor substrate; and forming a through electrode by growing an electroconductive film so as to fill the hole therewith, the through electrode extending through the semiconductor substrate and contacting with the protruding portion.

Since the through electrode is formed from the side of the back surface of the semiconductor substrate according to the aspect of the present invention, a deterioration of the semiconductor device formed on the device-forming surface can be inhibited. In addition, the protruding portion is provided and the through electrode contacting with the protruding portion is formed in the side of the back surface of the semiconductor substrate. Consequently, a stable manufacture of the semiconductor device configured to provide a prevention from a falling off of the electrode from the side of the back surface can be achieved with an improved production yield.

As described above, according to the present invention, a falling off of the through electrode can be inhibited without decreasing performances and/or a reliability of the semiconductor device having the through electrode, by providing the protruding portion that is in contact with the through electrode in the vicinity of the back surface the semiconductor substrate.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be presented.

FIRST EMBODIMENT

Figure 1:
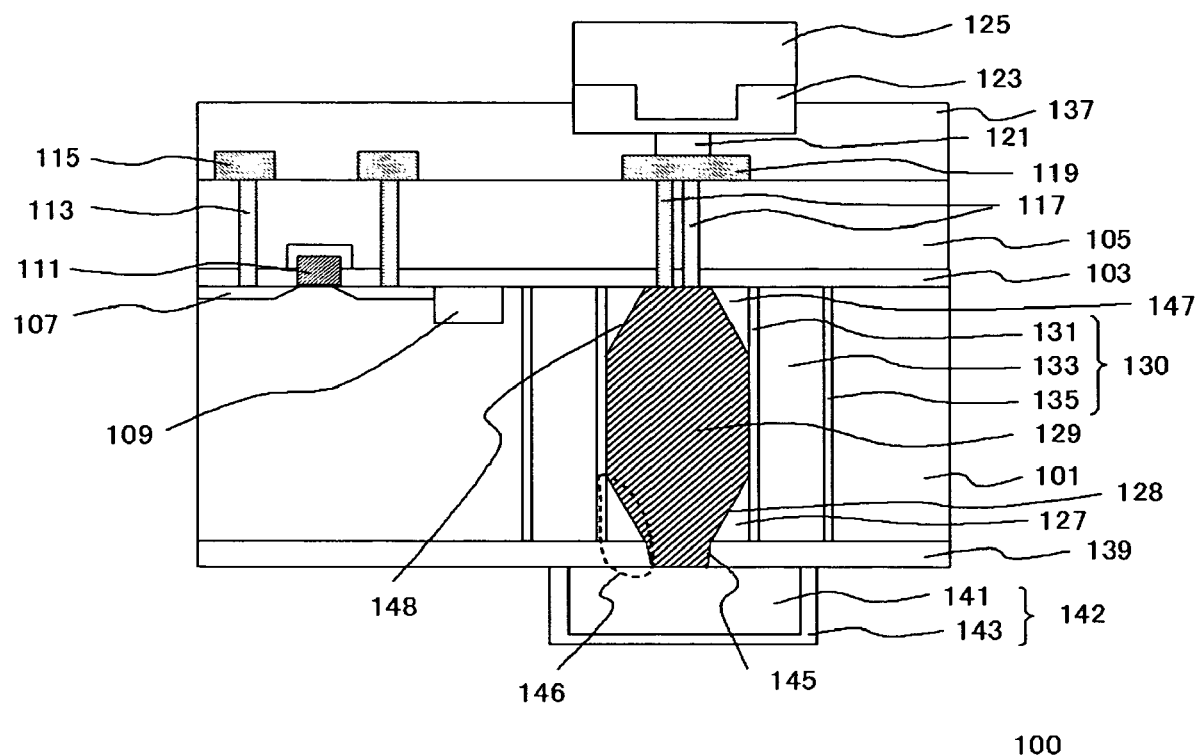
FIG. 1 is a cross-sectional view, illustrating a configuration of a semiconductor device according to an embodiment.

FIG. 1 is a cross-sectional view, illustrating a configuration of a semiconductor device of the present embodiment. A semiconductor device 100 shown in FIG. 1 includes: a semiconductor substrate (silicon substrate 101); a through electrode 129 extending through the silicon substrate 101; an annular cylindrical insulating film (first insulating ring 130) provided in a circumference of a side surface of the through electrode 129 and extending through the semiconductor substrate 101; and a protruding portion 146, being provided at least in the vicinity of a back surface of a device-forming surface of the semiconductor substrate 101 so as to contact with the through electrode 129, and protruding in a direction along the surface of the semiconductor substrate 101 toward an interior of the through electrode 129. The semiconductor device 100 further includes a back surface insulating film 139 provided so as to contact with the back surface of the silicon substrate 101.

The protruding portion 146 is an annular cylindrical portion, which is provided in the reverse side of the device-forming surface so as to surround the through electrode 129. The protruding portion 146 is composed of a silicon substrate remaining portion 127 and a portion of the back surface insulating film 139. The protruding portion 146 includes a tapered surface 145 and a tapered surface 128, and thus has a geometry, in which a diameter thereof is increased from the back surface of the semiconductor device 100 toward the interior of the silicon substrate 101.

The back surface insulating film 139 composes at least a part of the protruding portion 146. More specifically, a portion of the protruding portion 146 is composed of an insulating material. The back surface insulating film 139 is provided so as to protrude from the inner side surface of the first insulating ring 130 toward the inside of the through electrode 129, and such protruded component composes the protruding portion 146. On the other hand, the back surface insulating film 139 has an aperture of a smaller diameter than a diameter of the through electrode 129, and a side surface of the aperture forms the tapered surface 145.

In the semiconductor device 100, a predetermined region of the silicon substrate 101 is removed, and the predetermined removed region is provided with a first insulating ring 130 and a through electrode 129, and a region formed of a remained portion of the silicon substrate 101 is provided between a region for forming the annular cylindrical insulating film 130 and a region for forming the through electrode 129. The semiconductor device 100, more specifically, includes a silicon substrate remaining portion 127 and a silicon substrate remaining portion 147 as the regions composed of the remained silicon substrate 101. In other words, the silicon substrate remaining portion 127 is composed of the same material as the silicon substrate 101.

In regions of the semiconductor device 100 except the region for forming the silicon substrate remaining portion 127 and the region for forming the silicon substrate remaining portion 147, the side surface of the through electrode 129 is in contact with the inner side surface of the first insulating ring 130.

The silicon substrate remaining portion 127 is a circular ring-shaped region, in which an inner diameter thereof is increased from the side of the back surface of the silicon substrate 101 toward the side of the device-forming surface thereof, and thus has a tapered surface 128. At least a portion of the protruding portion 146 is composed of the silicon substrate remaining portion 127, which is a region composed of the remained portion of the silicon substrate 101.

The silicon substrate remaining portion 147 has a geometry, in which an inner diameter thereof is increased from the device-forming surface toward the side of the back surface thereof, and thus has a tapered surface 148. The silicon substrate remaining portion 147 forms another protruding portion, in addition to the protruding portion 146 provided in the side of the back surface of the silicon substrate 101. In vicinity of the device-forming surface of the silicon substrate 101, the through electrode 129 has a diameter decreasing (inversely tapered) toward the device-forming surface. Further, in the vicinity of the back surface of the silicon substrate 101, the through electrode 129 has a diameter increasing (tapered) toward the device-forming surface.

The first insulating ring 130 includes a plurality of insulating films deposited to form concentric cylinders (SiN film 131, $SiO_2$ film 133 and SiN film 135). While the simplest constitution of the insulating film is a dual-layer structure composed of the $SiO_2$ films 133, an additional barrier film for preventing a diffusion of a metal into a compound such as SiN, SiCN and the like may be further included to provide a better performance, since the constitution including the additional barrier film can prevent the device from being deteriorated due to a contamination of metal.

In addition, the first insulating ring 130 may at least include insulating films disposed in both of the inside of the ring (side of through electrode 129) and the outside thereof (side of silicon substrate 101), and for example, as illustrated in eighth embodiment, a portion of an electroconductive film may be included in the inside thereof.

Film thickness of the whole of the first insulating ring 130 in a direction along the surface of the substrate is presented as, for example, about 2 to 5 μm. Having such configuration, characteristics for filling in the process for forming the first insulating ring 130 can be further improved.

Further, in the semiconductor device 100, a SiN film 103, an insulating interlayer 105 and an insulating interlayer 137 are formed in this sequence on the device-forming forming surface of the silicon substrate 101. The through electrode 129 is coupled to a plurality of through electrode connecting plugs 117, which extend through the insulating interlayer 105 and the SiN film 103.

A back surface bump 142 is provided on the reverse side of the device-forming surface so as to contact with the through electrode 129. The back surface bump 142 is configured to be housed within a space defined by inner side of the outer side surface of the first insulating ring 130, or in other words within a space defined by the side of the through electrode 129 of the outer side surface of the first insulating ring 130.

Further, the device-forming surface of the silicon substrate 101 is provided with a predetermined device such as a transistor including a diffusion layer 107 and a gate electrode 111 formed thereon. A device isolation region 109 is provided in the lateral side of the transistor to provide an isolation thereof from other devices.

Further, transistor connecting plugs 113 and through electrode connecting plugs 117 extend through the SiN film 103 and the insulating interlayer 105. The transistor connecting plugs 113 couple the diffusion layer 107 with the interconnects 115 provided on the insulating interlayer 105. Similarly, the through electrode connecting plugs 117 couple the through electrode 129 with an interconnect 119 on the insulating interlayer 105.

The interconnects 115 and the interconnect 119 are located in the same level, and both are primary interconnects in FIG. 1. The interconnects 115 and the interconnect 119 are embedded within the insulating interlayer 137.

A connecting plug 121, an electrode pad 123 and a bump 125 are provided on the interconnect 119 in this sequence. A plurality of through electrode connecting plugs 117 are provided so as to contact with one through electrode 129. The back surface bump 142 is coupled to the bump 125 through the through electrode 129 and a plurality of through electrode connecting plugs 117. This configuration further ensures an electrical conduction between one and the other surfaces of the silicon substrate 101.

Next, a process for manufacturing the semiconductor device 100 will be described. The manufacturing process includes the following steps of:

forming an annular cylindrical insulating film 130, by selectively removing the silicon substrate 101 from a side of a device-forming surface of the silicon substrate 101 to form an annular cylindrical concave portion, then filling an insulating film in an interior of the annular cylindrical concave portion and removing portions of the insulating film located outside of the annular cylindrical concave portion;

forming a predetermined semiconductor device in the device-forming surface;

reducing a thickness of the silicon substrate 101 from the back surface thereof, after the step of forming the semiconductor device;

providing an aperture 187 (FIG. 13A), by providing the back surface insulating film 139 on the back surface and selectively removing a predetermined region of the back surface insulating film 139, after the step of reducing the thickness of the silicon substrate 101;

forming a hole (through hole 193 shown in FIG. 13B) and forming a protruding portion 146, by selectively removing a predetermined region of the silicon substrate 101 remaining in the inside of the first insulating ring 130 through the aperture 187 of the back surface insulating film 139 as a mask from side of the back surface to form the hole (through hole 193 shown in FIG. 13B), and utilizing a portion of the back surface insulating film 139 that protrudes in a direction along the surface of the silicon substrate 101 as the protruding portion 146, the hole including a region having larger diameter than the diameter of the aperture 187 and extending through the silicon substrate 101; and forming the through electrode 129 by growing an electroconductive film such as a metallic film and the like so as to fill the through hole 193 therewith, the through electrode 129 extending through the silicon substrate 101 and contacting with the protruding portion 146.

The back surface of the annular cylindrical insulating film is exposed by conducting the operation for reducing the step of thickness of the silicon substrate 101 from the back surface thereof.

In the steps of forming the through hole 193 and forming a protruding portion 146 by utilizing a portion of the back surface insulating film 139, a portion of the silicon substrate 101 is remained in the inside of the first insulating ring 130 in the vicinity of the back surface of the silicon substrate 101.

A photopolymer film (photosensitive epoxy resin film 185 in FIG. 13A), for example, is formed for serving as the back surface insulating film 139.

Figure 15A:
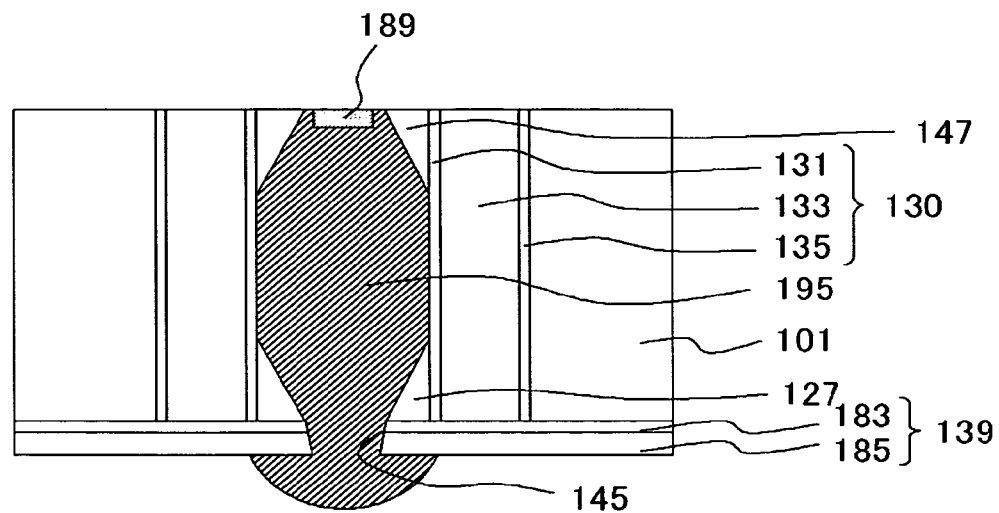
FIGS. 15A and 15B are cross-sectional views, illustrating a process for manufacturing the semiconductor device according to the embodiment.

The step of forming the through electrode 129 includes an step of growing a metallic film (copper (Cu) film 195 in FIG. 15A) in the interior of the through hole 193 from the side of the device-forming surface via an electroless plating process.

Further, the step of forming the through electrode 129 includes growing the Cu film 195 from the interior to the outside of the through hole 193, and then removing portions of the Cu film 195 formed outside of through hole 193 to be planarized, and the process for manufacturing the semiconductor device 100 further includes forming the back surface bump 142 by growing another metallic film (nickel (Ni) film 141, gold (Au) film 143) from an exposed surface of the Cu film 195 in the side of the back surface via an electroless plating process, after the operation for forming the through electrode 129.

Figure 9A:
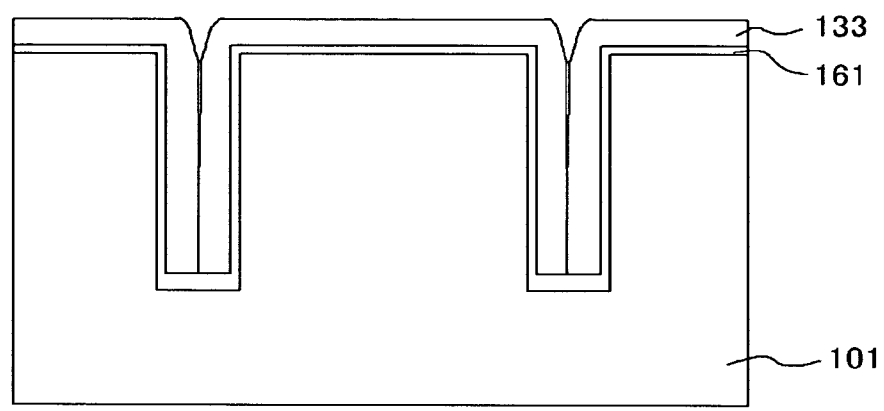
FIGS. 9A and 9B are cross-sectional views, illustrating a process for manufacturing the semiconductor device according to the embodiment.
Figure 9B:
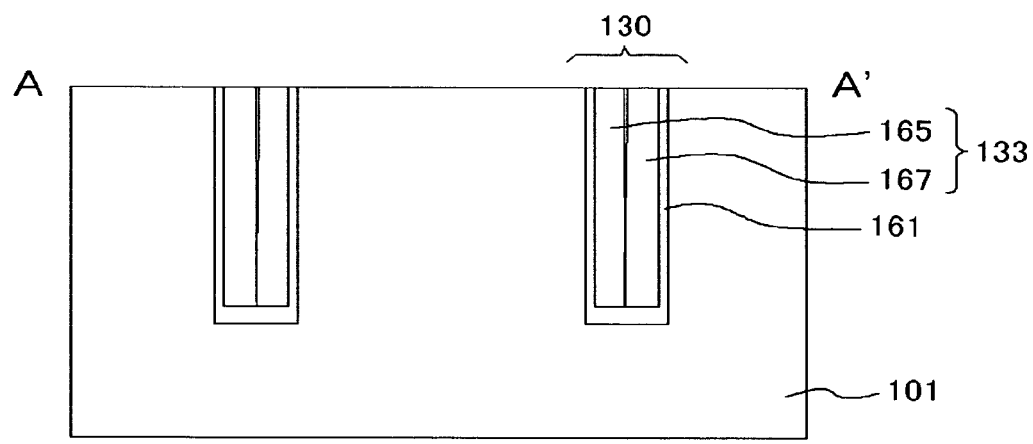
Figure 10:
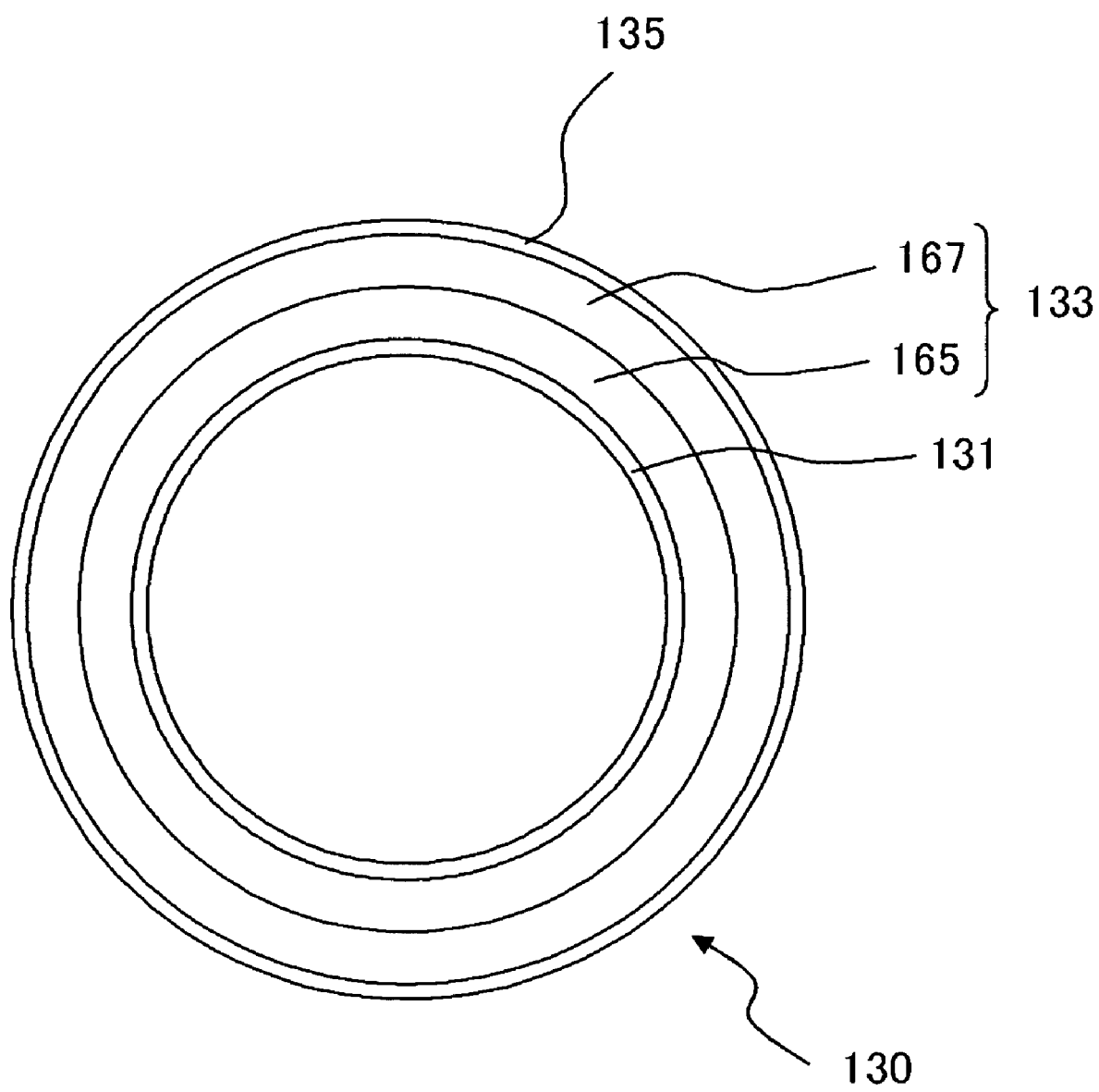
FIG. 10 a plan view, illustrating the configuration of the semiconductor device according to the embodiment.

The process for manufacturing the semiconductor device 100 will be further described in detail in reference to FIG. 9A to FIG. 15B. FIGS. 9A and 9B and FIG. 11A to FIG. 15B are cross-sectional views, illustrating a process for manufacturing the semiconductor device 100. FIG. 10 is a diagram, useful in describing a geometry of the first insulating ring 130.

First of all, as shown in FIG. 9A, a patterned resist having annular cylindrical apertures (not shown) corresponding to the geometry of the first insulating ring 130 is formed on a surface serving as a device-forming surface of the silicon substrate 101 by employing a lithographic technology. The silicon substrate 101 is dry etched through a mask of such resist film to form annular cylindrical concave portions corresponding to the geometry of the first insulating ring 130. In this case, a depth of the concave portion is appropriately selected, and may be, for example, from 20 μm or more and 200 μm or less.

After the resist film is removed, an SiN film 161 and an SiO$_2$ film 133 are deposited on the silicon substrate 101 in this sequence (FIG. 9A). The thickness of the SiN film 161 may be selected as, for example, 100 nm. In addition, the SiO$_2$ film 133 may be composed of, for example, a borophosphosilicate glass (BPSG) film obtained by a chemical vapor deposition (CVD) process. Then, portions of the SiO$_2$ film 133 deposited in regions except the cylindrical concave portion are remove via a chemical mechanical polishing (CMP) process (FIG. 9B). In addition to above, FIG. 9B further illustrates a condition, where the portions of the SiN film 161 deposited in regions except the concave portion are further removed.

FIG. 10 is a plan view of the first insulating ring 130 shown in FIG. 9B viewed from the upper direction. FIG. 10 corresponds to a two-dimensional geometry of the first insulating ring 130. As shown in FIG. 9B and FIG. 10, the SiO$_2$ film 133 is a multi-layered film composed of the SiO$_2$ film 165 and the SiO$_2$ film 167. In addition, a combination of the SiN film 131 and the SiN film 135 shown in FIG. 10 is the SiN film 161 shown in FIG. 9B.

Figure 11A:
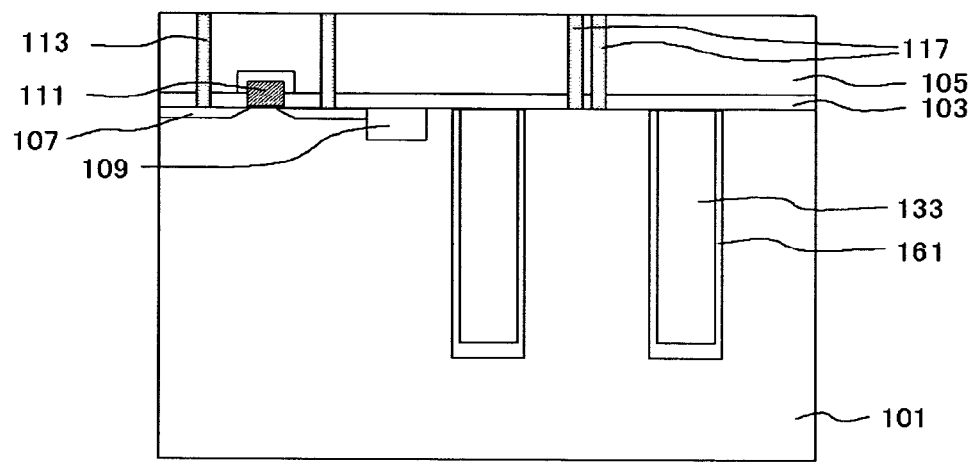
FIGS. 11A and 11B are cross-sectional views, illustrating a process for manufacturing the semiconductor device according to the embodiment.

Next, as shown in FIG. 11A, the device isolation region 109, the diffusion layer 107 and the gate electrode 111 are respectively formed on the device-forming surface of the silicon substrate 101. The device isolation region 109 may be configured of, for example, shallow trench isolation (STI). In addition, the SiN film 103 and the insulating interlayer 105 are provided on the silicon substrate 101 in this sequence.

Subsequently, portions of the insulating interlayer 105 and the SiN film 103 are selectively removed to form a hole penetrating these insulating films. After an electroconductive film is embedded within the interior of the hole, portions of the electroconductive film formed outside of the hole are removed to form the transistor connecting plugs 113 and the through electrode connecting plugs 117. Materials for composing the transistor connecting plug 113 and the through electrode connecting plug 117 may be, tungsten (W), for example.

Figure 11B:
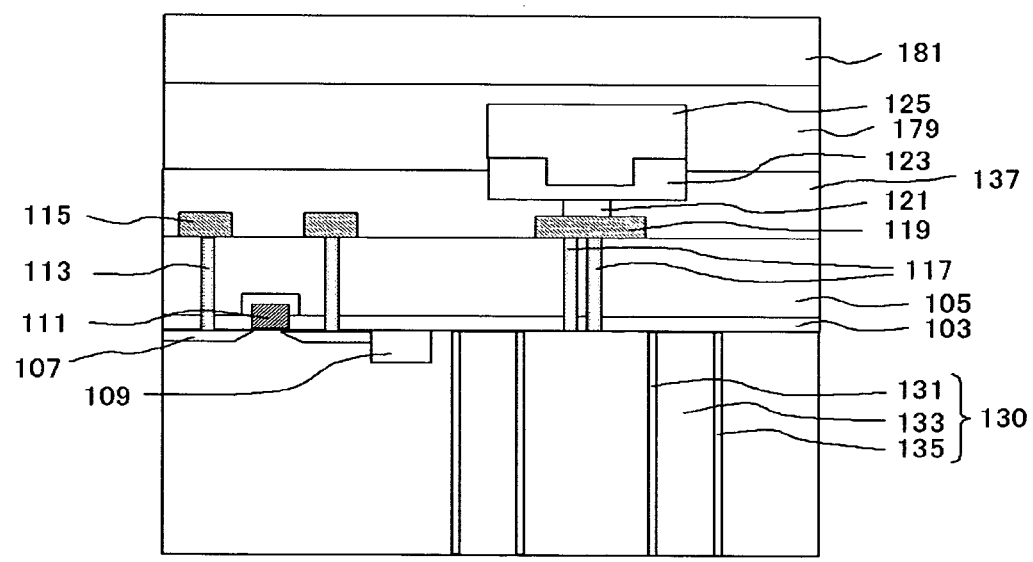

Further, as shown in FIG. 11B, the interconnects 115 coupled to the transistor connecting plugs 113 and the interconnect 119 coupled to the through electrode connecting plugs 117 are respectively formed on the insulating interlayer 105.

Then, the insulating interlayer 137 is formed over the interconnects 115 and the interconnect 119. Further, the electrode pad 123 and the bump 125 for connecting to the interconnect 119 are formed in this sequence. Materials for forming the electrode pad 123 may be, for example, aluminum (Al), copper (Cu), nickel (Ni) or titanium nitride (TiN). In addition, material of forming the bump 125 may be, for example, gold (Au) or solder.

In addition to above, in the present embodiment and the following embodiments, a predetermined number of upper layers such as interconnect layers may be formed above the interconnect 119, and then, the electrode pad 123 and the bump 125 may be formed. More specifically, multiple-layered interconnect structure may be formed in the insulating interlayer 137.

Then, a cohesive agent layer 179 is formed on the device-forming surface, and then a support 181 is affixed thereon. The cohesive agent layer 179 may be made of, for example, an adhesive tape. Typical adhesive tape is composed of a base member and adhesion layers formed on the both sides of the base member. The base member composing the adhesive tape may be made of, for example, a polyolefin-type resin, a polyester-type resin or the like. In addition, the cohesive agent composing the adhesive tape may be made of, for example, an acrylic-type emulsion cohesive agent, an acrylic-type solvent cohesive agent, an urethane-type cohesive agent or the like. In addition, materials for forming the support 181 may include, for example, quartz or a glass such as PYREX (registered trademark) and the like. This can fully ensure resistances to heat, chemical agent, external force or the like that will be required in the process for reducing the thickness of the silicon substrate 101 via a back surface grinding, which will be discussed later. Alternatively, any material except glass may also be employed, if the material exhibits such resistances. For example, plastic materials such as acrylic resin and the like may alternatively be employed.

Then, the back surface grinding for the silicon substrate 101 is carried out. The back surface grinding process is conducted by a mechanical polishing process. The thickness of the ground silicon substrate 101 may be, for example, about 50 to 500 µm. Such thickness provides an exposure of the bottom surface of the $SiO_2$ film 133 from the back surface, and dividing the SiN film 161 into the SiN film 131 and the SiN film 135. Such process eventually provides the first insulating ring 130.

Figure 12A:
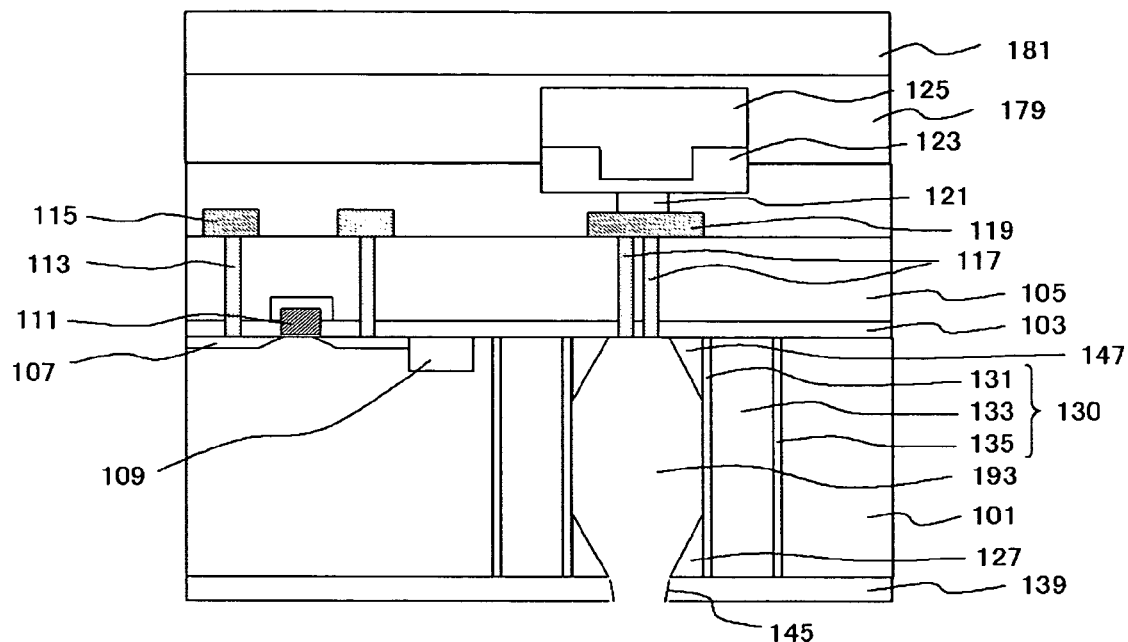
FIGS. 12A and 12B are cross-sectional views, illustrating a process for manufacturing the semiconductor device according to the embodiment.

Next, as shown in FIG. 12A, portions of the silicon substrate 101 in the region for forming the through electrode 129 are removed. In this case, in the region for forming the through electrode 129, or more specifically in the region inside of the first insulating ring 130, the silicon substrate remaining portion 127 is formed in the vicinity of the back surface of the silicon substrate 101 and the silicon substrate remaining portion 147 is formed in the vicinity of the device-forming surface. The step illustrated in FIG. 12A will be described more in detail as follows.

Figure 13A:
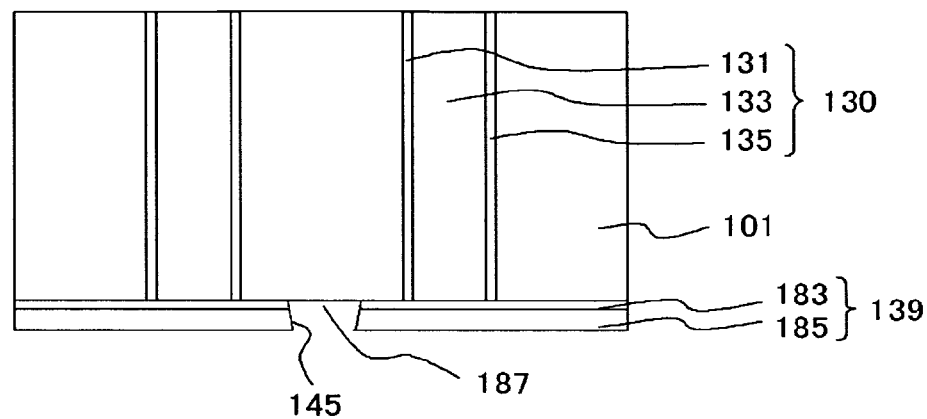
FIGS. 13A and 13B are cross-sectional views, illustrating a process for manufacturing the semiconductor device according to the embodiment.
Figure 13B:
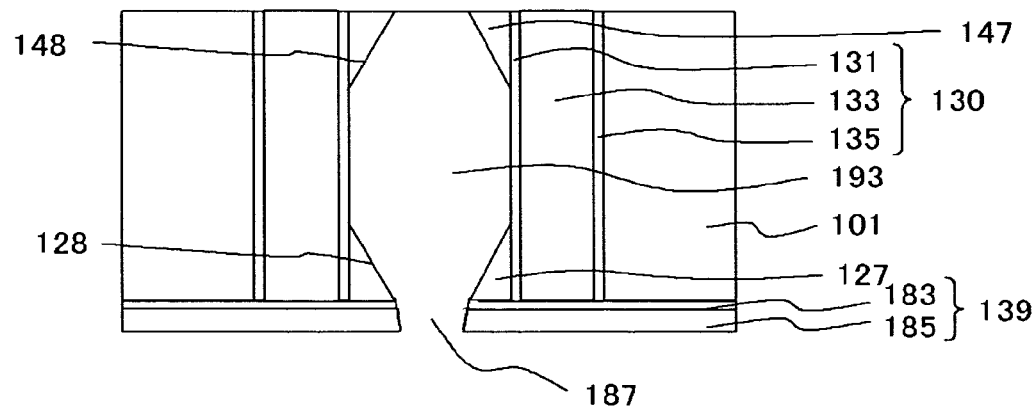

FIG. 13A and FIG. 13B are cross-sectional views for describing the step illustrated in FIG. 12A in further detail.

First of all, as shown in FIG. 13A, an SiN film 183 and a photosensitive epoxy resin film 185 are formed on a back surface of the silicon substrate 101 in this sequence. A multi-layered film of the SiN film 183 and the photosensitive epoxy resin film 185 correspond to the back surface insulating film 139 shown in FIG. 1. In a portion of the inner region of the first insulating ring 130, the SiN film 183 and the photosensitive epoxy resin film 185 are selectively removed to provide an aperture 187, and a tapered surface 145 is formed in these insulating films. Since the use of the photosensitive epoxy resin film 185 provides sufficiently lower temperature for the baking operation in the deposition process, the configuration is suitable for the deposition after forming the device. Alternatively, a bismaleimide triazine (BT) resin film or the like may be employed for the film that can be formed at relatively lower baking temperature, in place of the photosensitive epoxy resin film 185.

Then, as shown in FIG. 13B, the portion of the silicon substrate 101 remained in the inside of the first insulating ring 130 is etched off through a mask of the back surface insulating film 139 to form a through hole 193, which has a region having a diameter that is larger than the diameter of the aperture 187. In this case, the etch process may be conducted by a plurality of etch steps to form the silicon substrate remaining portion 127 and the silicon substrate remaining portion 147. Alternatively, a portion of the back surface insulating film 139 is utilized as the protruding portion 146 (FIG. 1), which protrudes toward the inside of the through hole 193 in a direction toward the inside of the surface of the substrate from the side wall of the through hole 193.

The through hole 193 is formed by an etch process including multiple etch steps. More specifically, first of all, the silicon substrate 101 is dry etched from the back surface thereof so as to provide a geometry (inversely-tapered geometry) of gradually narrowing toward the side of the back surface in the vicinity of the back surface thereof, thereby forming the silicon substrate remaining portion 127 having the tapered surface 128.

Next, a combination of an etchant gas and a deposition gas is employed, so that the etch process is proceeded, while forming a protective film on the side wall with a deposition gas. This configuration provides the etching in the direction normal to the silicon substrate 101, obtaining a geometry that is vertical to the etched surface. Typical combination of the etchant gas and the deposition gas in this case may be, for example, an etchant gas of sulfur hexafluoride ($SF_6$) and a deposition gas of, for example, octafluoro cyclobutane ($C_4F_8$), hydrogen bromide (HBr), silicon tetrafluoride ($SiF_4$) or the like.

Thereafter, the etch process in a transverse direction is proceeded by selecting a reduced amount of the deposition gas in the process conditions described above. This provides the inversely tapered geometry, thereby forming the silicon substrate remaining portion 147 having the tapered surface 148.

Figure 12B:
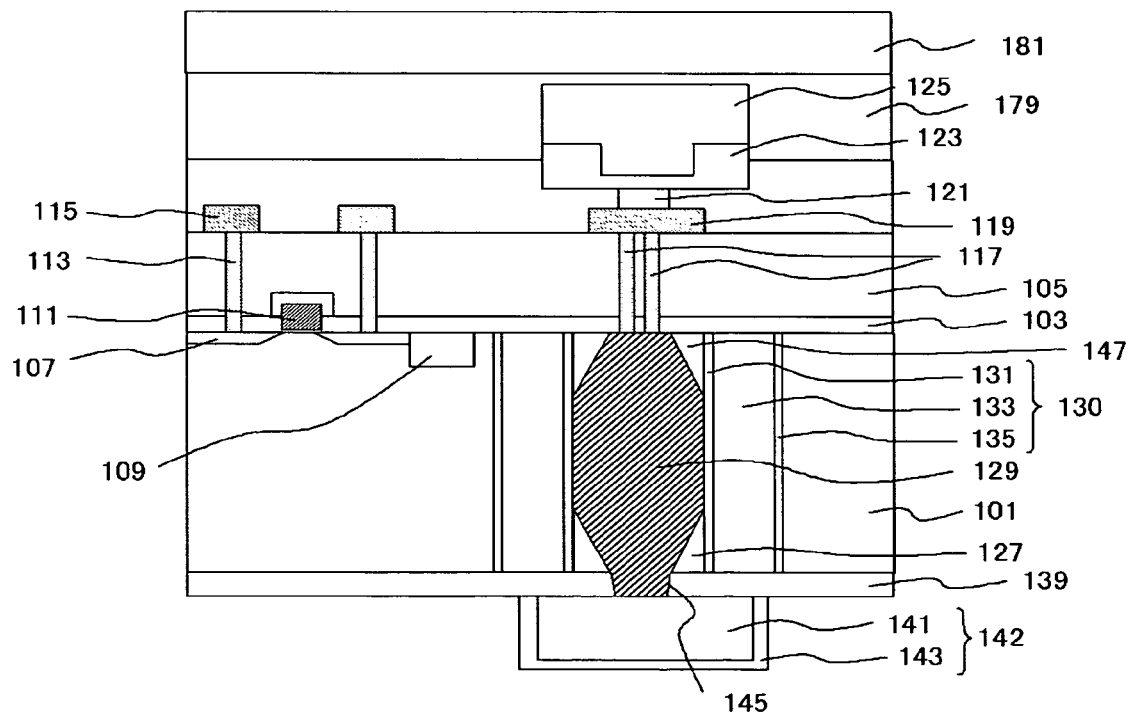

Next, as shown in FIG. 12B, the through electrode 129 is formed in the through hole 193, and further, the back surface bump 142, which is in contact with the through electrode 129 in the side of the back surface, is formed. The step illustrated in FIG. 12B will be described in detail as follows. FIG. 14A, FIG. 14B, FIG. 15A and FIG. 15B are cross-sectional views, further describing the step of FIG. 12B in detail.

Figure 14A:
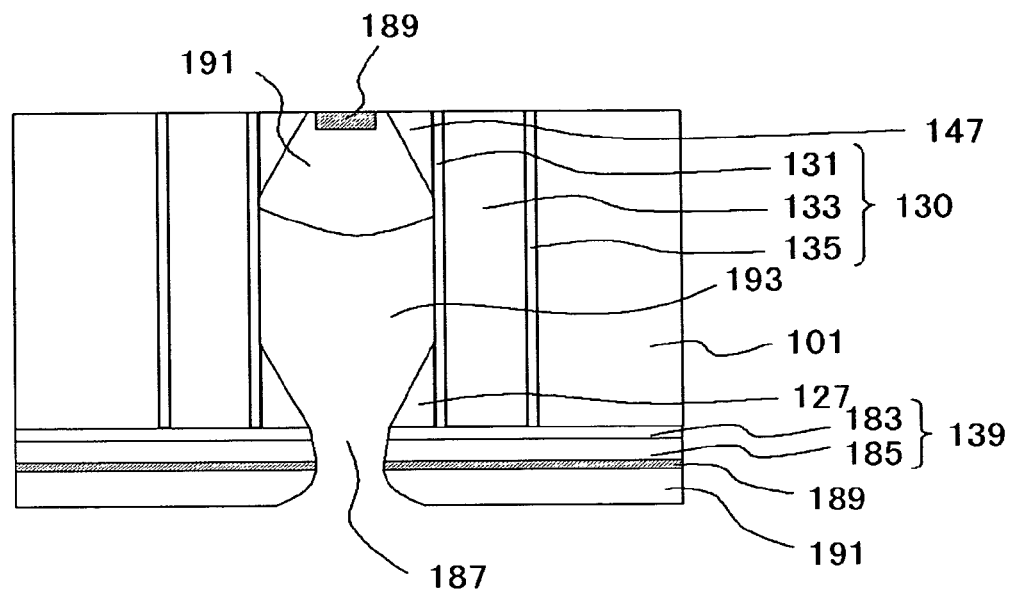
FIGS. 14A and 14B are cross-sectional views, illustrating a process for manufacturing the semiconductor device according to the embodiment.

First of all, as shown in FIG. 14A, sputtering processes for Ti and Cu are conducted in this sequence from the side of the back surface to form a Cu/Ti seed 189. In addition to above, in this specification, a constitution of a multiple-layered structure having an upper layer and a lower layer is represented as "upper layer/lower layer (substrate side)". The Cu/Ti seed 189 is formed on the back surface insulating film 139 and on the bottom of the through hole 193.

Then, a photosensitive resist film 191 is formed on the Cu/Ti seed 189. The photosensitive resist film 191 is formed above the back surface insulating film 139 and in the interior of the through hole 193.

Figure 14B:
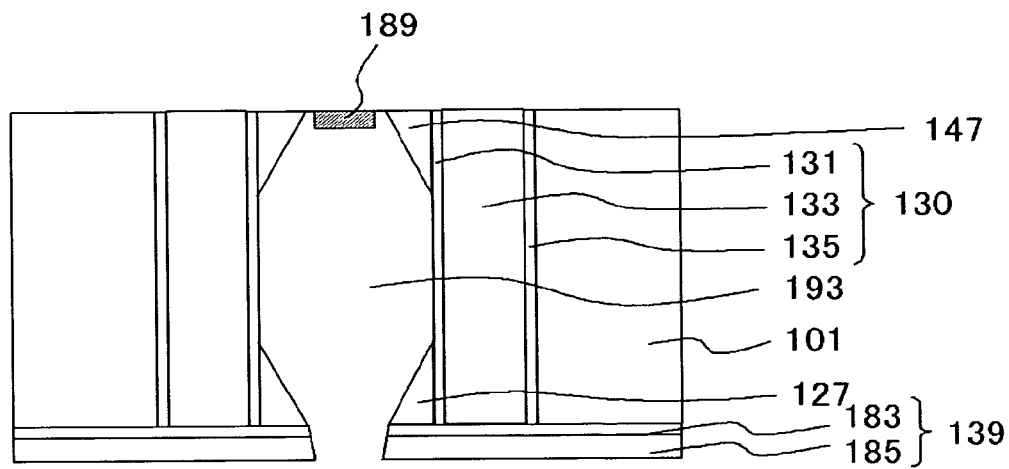

Subsequently, as shown in FIG. 14B, the photosensitive resist film 191 is selectively remained on the bottom of the through hole 193 by irradiating light diagonally to the normal direction to the silicon substrate 101 from the side of the back surface. If the depth of the through hole 193 is sufficiently larger, the photosensitive resist film 191 can be selectively remained in the bottom of the through hole 193, even if a vertical light irradiation over the wafer surface is conducted without employing an oblique exposure. In addition to above, the remained portion of the photosensitive resist film 191 is not shown in FIG. 14B. The Cu/Ti seed 189 is partially removed through a mask of the remained portion of the photosensitive resist film 191 to selectively leave a portion of the Cu/Ti seed 189 in the bottom of the through hole 193. The portion of the photosensitive resist film 191 remained in the through hole 193 is removed, and thereafter, the Cu film 195 is grown via an electroless plating process. A bottom-up growth of the Cu film 195 within the entire through hole 193 can be ensured by employing the electroless plating process. Consequently, a creation of a void in the through electrode 129 can be inhibited. The Cu film 195 is formed to extend from the interior of the through hole 193 to the outside thereof (FIG. 15A).

Figure 15B:
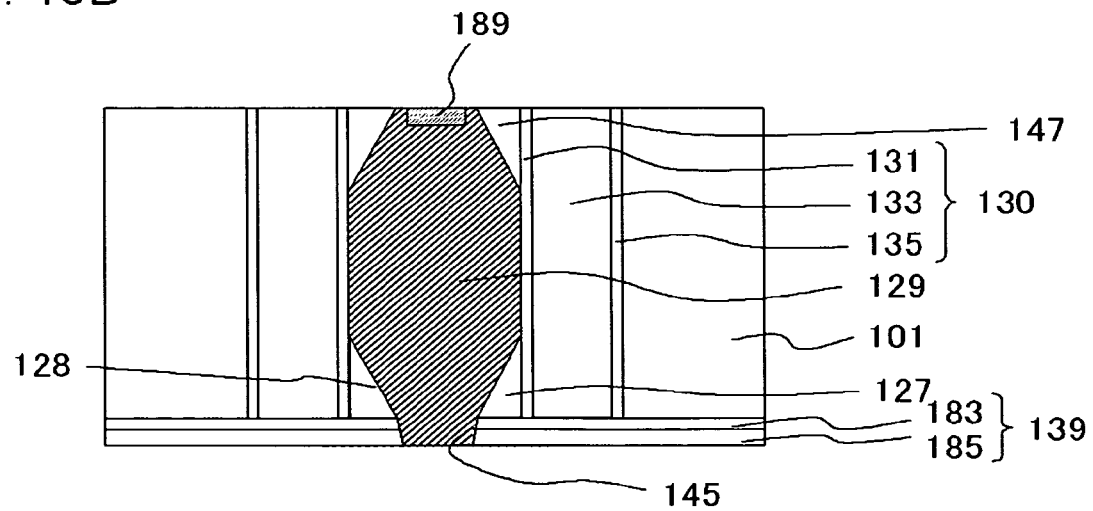

Further, as shown in FIG. 15B, a back surface grinding process is conducted. This processing provides a planarization of the surface of the Cu film 195 and a reduced thickness of the photosensitive epoxy resin film 185 to, for example, about 20 µm. This configuration provides the through electrode 129, which is in contact with the tapered surface 145 and the tapered surface 128 in the vicinity of the back surface and is latched by the protruding portion 146. In this step, a chemical mechanical polishing (CMP) may alternatively be conducted for the back surface thereof, in place of the back surface grinding process. In this case, mainly on the back surface, portions of the Cu film 195 projecting from the resin surface is removed, so that a quantity of the removed photosensitive epoxy resin film 185 is reduced, thereby reducing the capacity of the bump over the silicon substrate 101.

Then, returning to the process illustrated in FIG. 12B, a resist film (not shown) is formed on the back surface. The resist film is provided with an aperture in a position corresponding to the position of the through electrode 129 to expose the through electrode 129. Then, the Ni film 141 and the Au film 143 are sequentially formed by employing, for example, an electroless plating process to obtain the back surface bump 142. The semiconductor device 100 shown in FIG. 1 is obtained by the above-mentioned procedure.

Next, advantageous effects obtainable by employing the configuration of the semiconductor device 100 will be described.

In the structure of the semiconductor device 100, the protruding portion 146 contacting with the through electrode 129 is provided in the vicinity of the back surface of the silicon substrate 101. Further, semiconductor device 100 is configured that the through electrode 129 can be formed from the back surface of the silicon substrate 101. Consequently, the semiconductor device 100 exhibits an improved reliability of the device, and, when a stress is exerted over the through electrode 129, the protruding portion 146 latches the through electrode 129, so that the structure of the semiconductor device prevents the through electrode 129 from being fallen off or detached from the side of the back surface.

Further, in the present embodiment, the first insulating ring 130 is provided so as to surround sides of the through electrode 129. Consequently, an electrical insulation of the periphery of the through electrode 129 can be ensured. Thus, a fine pitch arrangement of the through electrodes 129 with narrower intervals can be achieved. Further, in the semiconductor device 100, the silicon substrate remaining portion 127 and the silicon substrate remaining portion 147 are provided in the vicinity of the back surface of the silicon substrate 101 and in the vicinity of the device-forming surface of the silicon substrate 101, respectively. The region inside of the first insulating ring 130 can be reinforced by remaining a portion of the silicon substrate in the inside of the first insulating ring 130. Consequently, a deterioration of or a damage to the first insulating ring 130 can be inhibited, when a stress is exerted over the through electrode 129 or over the vicinity thereof.

Here, as have been described in reference to FIG. 10, since the first insulating ring 130 is a multiple-layered member composed of a plurality of insulating films, the first insulating ring 130 includes interfaces between the insulating films. Consequently, the first insulating ring 130 is a member having relatively lower strength. Further, since the through electrode 129 is formed via an electroless plating process in the present embodiment, an adhesiveness between the through electrode 129 and the SiN film 131 on the side wall of the through electrode 129 is relatively lower.

Therefore, in the present embodiment, a portion of the silicon substrate 101 is remained between the first insulating ring 130 and the through electrode 129, so that strengths of the first insulating ring 130 and a region inside thereof is sufficiently ensured. More specifically, the back surface insulating film 139 is provided so as to contact with the silicon substrate 101, and the silicon substrate remaining portion 127 is provided on the inner surface of the first insulating ring 130 so as to contact with the back surface insulating film 139. Further, SiN film 103 is provided so as to contact with the silicon substrate 101, and the silicon substrate remaining portion 147 is provided so as to contact with the SiN film 103. As such, a reinforcing structure is provided from the outer surface of the first insulating ring 130 through the end surface thereof to the inner side surface, such that, when a stress is concentrated on a region of the first insulating ring 130, for example, a creation of a crack in the first insulating ring 130 can be inhibited. Further, when a relatively larger force is exerted on the through electrode 129 or the first insulating ring 130 in the process for providing a connection of the back surface bump 142 to an external electrode, a deformation of the through electrode 129 or a deterioration of the first insulating ring 130 can be inhibited.

Further, since the silicon substrate remaining portion 127 and the silicon substrate remaining portion 147, which function as such reinforcement member, also function as a portion of the protruding portion 146 in the present embodiment, a prevention of a falling off of the through electrode 129 and a further enhanced strength of the first insulating ring 130 are achieved, thereby providing an improved reliability of the device.

Further, since the first insulating ring 130 is a multi-layered film composed of a plurality of insulating films in the semiconductor device 100, a reduction of the capacity can be achieved.

Further, since the first insulating ring 130 includes the SiN film in the semiconductor device 100, a diffusion of components contained in the through electrode 129 can be preferably prevented, even though an inner surface of the through hole 193 is not provided with a barrier film (FIG. 13B) during the formation of the through electrode 129.

Further, in the present embodiment, the first insulating ring 130 is a multi-layered film composed of the SiN film and the $SiO_2$ film 133. This configuration provides a reduced dielectric constant of the insulating film, as compared with a case of forming the whole first insulating ring 130 with an SiN film. As such, a plurality of functions can be presented to the first insulating ring 130 by employing a combination of various types of insulating films for materials composing the first insulating ring 130.

Further, the back surface insulating film 139 is provided with the aperture 187 having a diameter smaller than the diameter of the through electrode 129, and the side surface of the aperture 187 is formed as the tapered surface 145 in the present embodiment, such that the silicon substrate remaining portion 127 can be stably manufactured via an etch process in the operations described above in reference to FIG. 12A and FIG. 12B.

In the following embodiments, differences from the first embodiment will be mainly described.

SECOND EMBODIMENT

Figure 2:
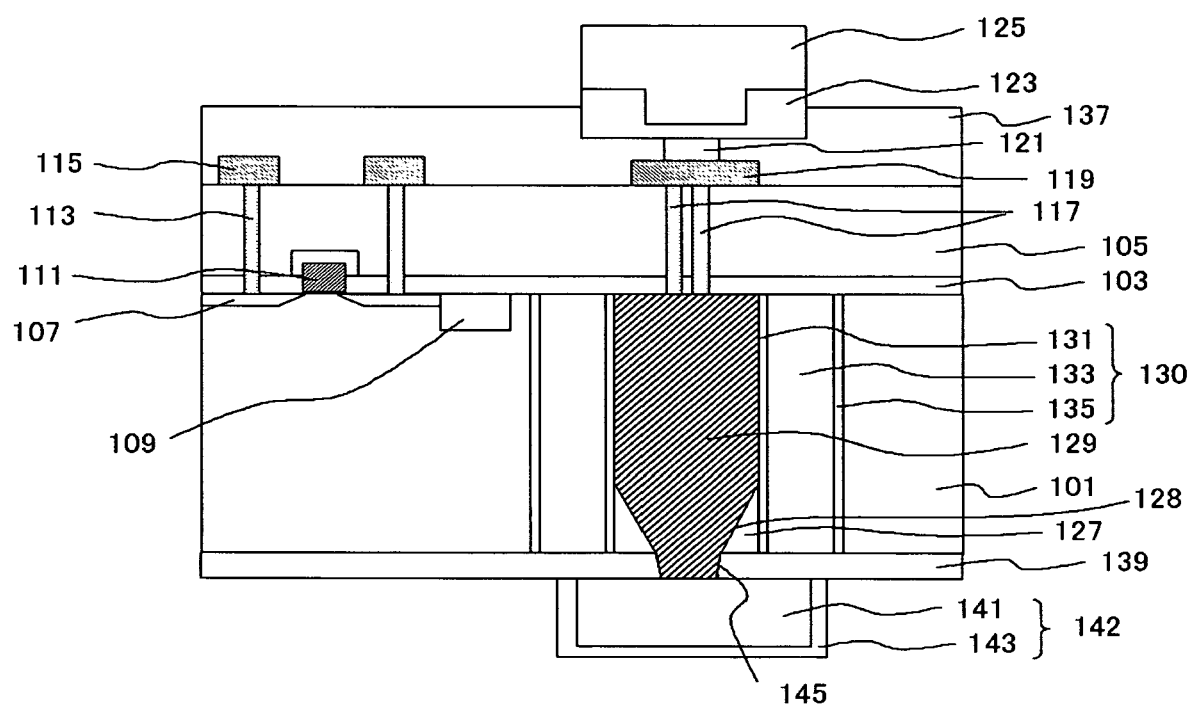
FIG. 2 is a cross-sectional view, illustrating a configuration of a semiconductor device according to an embodiment.

FIG. 2 is a cross-sectional view, illustrating a configuration of a semiconductor device of the present embodiment. Fundamental configuration of the semiconductor device shown in FIG. 2 is similar to the semiconductor device 100 illustrated in FIG. 1, except that: the silicon substrate remaining portion 147 is not provided; and in the vicinity of the device-forming surface of the silicon substrate 101, the portion of the silicon substrate 101 located in the interior of the first insulating ring 130 are all removed, and a Cu film is embedded in the removed region. More specifically, in FIG. 2, a region of the remained silicon substrate 101 is selectively provided in the vicinity of the back surface of the silicon substrate 101 in a region inside of the first insulating ring 130.

Since the protruding portion, which is composed of the tapered surface 145 and the silicon substrate remaining portion 127, is also provided at least in the vicinity of the back surface of the silicon substrate 101 in the present embodiment, similar advantageous effects as obtained by employing the configuration of first embodiment can be also obtained.

Further, when a portion of the silicon substrate 101 inside of the first insulating ring 130 is etched off from the side of the back surface in the process for manufacturing the semiconductor device shown in FIG. 2, it is only necessary to provide at least an etch step for providing the silicon substrate remaining portion 127, leading to a simplified control for the etch condition.

In addition to above, in the semiconductor device shown in FIG. 2, when a dry etch process is conducted for the silicon substrate 101 from the back surface to form the through hole 193, the silicon substrate 101 is, first of all, dry etched from the back surface thereof so as to provide a geometry (inversely-tapered geometry) of gradually narrowing toward the side of the back surface in the vicinity of the back surface thereof, thereby forming the silicon substrate remaining portion 127 having the tapered surface 128.

Next, a combination of an etchant gas and a deposition gas is employed, so that the etch process is proceeded, while forming a protective film on the side wall with a deposition gas. This configuration provides the etching in the direction normal to the silicon substrate 101, obtaining a geometry that is vertical to the etched surface. Typical combination of the etchant gas and the deposition gas in this case may be, for example, an etchant gas of $SF_6$ and a deposition gas of, for example, $C_4F_8$, HBr, $SiF_4$ or the like. Plasma density can be increased by increasing an radio frequency (RF) power or increasing gas pressure, so that the etching toward the transverse direction can be enhanced.

THIRD EMBODIMENT

Figure 3:
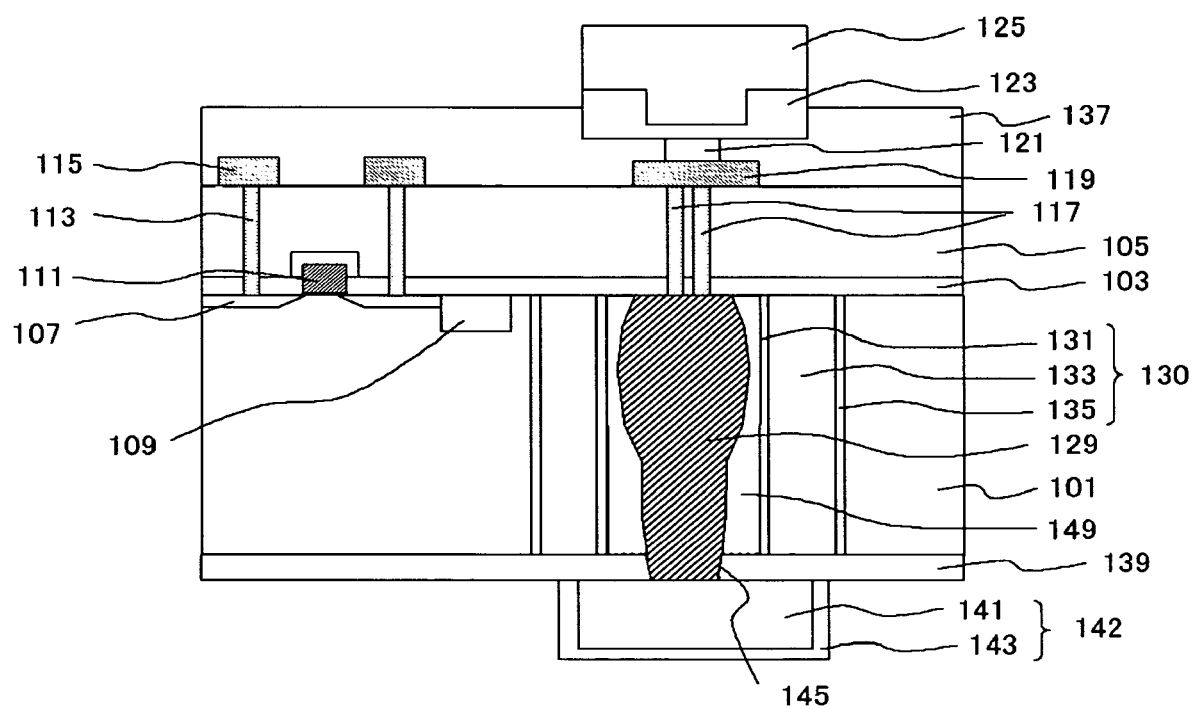
FIG. 3 is a cross-sectional view, illustrating a configuration of a semiconductor device according to an embodiment.

FIG. 3 is a cross-sectional view, illustrating a configuration of a semiconductor device of the present embodiment. Fundamental configuration of the semiconductor device shown in FIG. 3 is similar to the semiconductor device 100 illustrated in FIG. 1, except that a silicon substrate remaining portion 149 is provided to surround and covers the entire inner surface of the first insulating ring 130. The silicon substrate remaining portion 149 is an annular region, having a geometry, in which an inner diameter thereof is increased from the device-forming surface toward the interior of the silicon substrate 101 in the vicinity of the device-forming surface of the silicon substrate 101, and an inner diameter thereof is increased from the back surface toward the interior of the silicon substrate 101 in the vicinity of the back surface.

Since the protruding portion is also provided at least in the vicinity of the device-forming surface and the back surface of the silicon substrate 101 in the present embodiment, similar advantageous effects as obtained by employing the configuration of first embodiment can also be obtained.

Further, in the present embodiment, the silicon substrate remaining portion 149 is provided so as to surround the entire interior surface of the first insulating ring 130. This provides a configuration, which includes a frame composed of silicon provided within the inside of the first insulating ring 130. A frame composed of a material, such as silicon and the like, which exhibits higher strength than the first insulating ring 130, is provided in the inside of the first insulating ring 130, so that the first insulating ring 130 can be reinforced and protected from the side of the inner side surface. Thus, when a stress is exerted over the through electrode 129 or in vicinity thereof due to a junction between the back surface bump 142 and the external electrode or the like, a configuration for providing an inhibition to a deterioration or a failure of the insulating film composing the first insulating ring 130 can be presented. Thus, according to the present embodiment, a falling off of the through electrode 129 is inhibited, and a further improved reliability of the device can be presented.

In addition to above, in the semiconductor device shown in FIG. 3, when the silicon substrate 101 is dry etched from the back surface thereof to form the through hole 193, the dry etch process may be conducted while changing the etch condition during the etch process, so that the silicon substrate 101 can be remained on the entire inner surface of the first insulating ring 130 to form the silicon substrate remaining portion 149. For example, at an initial stage of the etch process, the etch process is conducted under an etching condition for forming an inversely tapered structure by employing a process described in first embodiment, and thereafter, the etching condition is changed to a vertical etching condition described in first embodiment. Then, at a stage that about one-half of the etch process is progressed, the condition is once changed to a condition similar to that for an isotropic etch process, so that a geometry shown in FIG. 3 is obtained. In order to obtain the etching condition similar to that for the isotropic etch process, deposition gas is reduced, and a bias voltage between an RF source and a stage is reduced. This condition allows the isotropic etch process.

FOURTH EMBODIMENT

Figure 4:
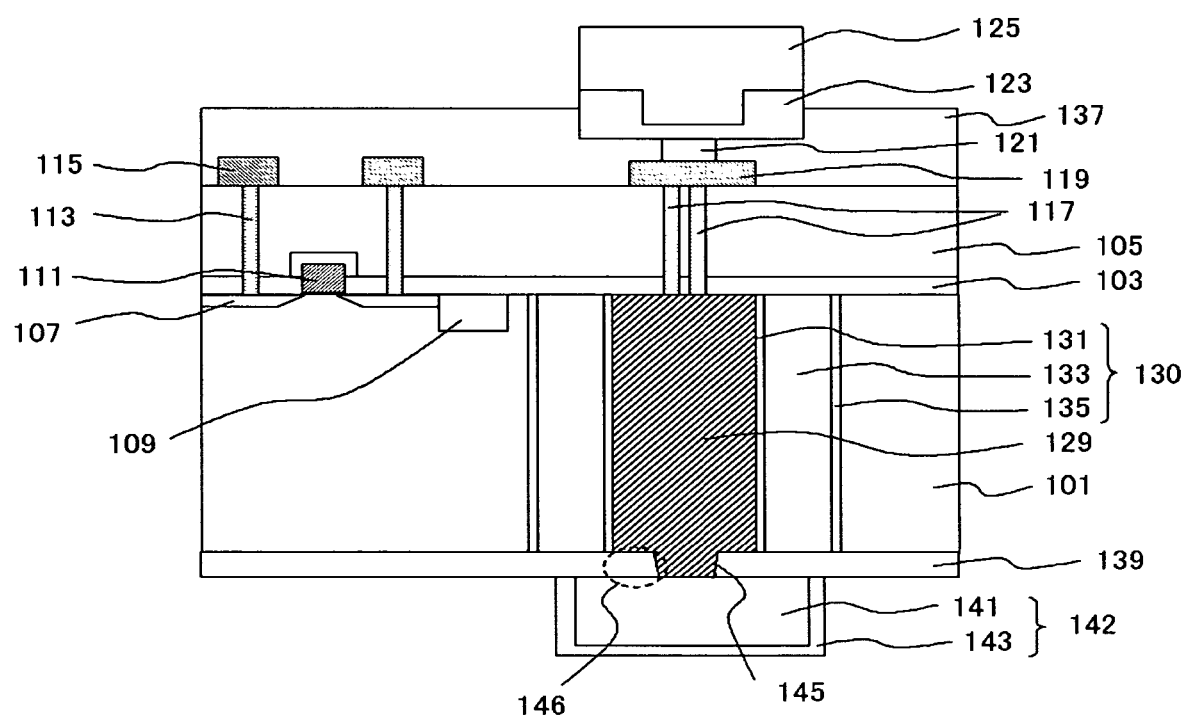
FIG. 4 is a cross-sectional view, illustrating a configuration of a semiconductor device according to an embodiment.

FIG. 4 is a cross-sectional view, illustrating a configuration of a semiconductor device of the present embodiment. Fundamental configuration of the semiconductor device shown in FIG. 4 is similar to the semiconductor device 100 illustrated in FIG. 1, except that the silicon substrate 101 in the entire region inside of the first insulating ring 130 is removed to provide a region for forming the through electrode 129.

Since the protruding portion 146 formed of the back surface insulating film 139, or more specifically the tapered surface 145, is included in the vicinity of the back surface of the silicon substrate 101, in the present embodiment, similar advantageous effects as obtained by employing the configuration of first embodiment can be also obtained. In addition, since it is only necessary to remove the silicon substrate 101 in the entire interior of the first insulating ring 130 in the present embodiment, it is not necessary to divide the etch process for removing the silicon substrate 101 into a plurality of steps, thereby providing a simplified etch process.

FIFTH EMBODIMENT

Figure 5:
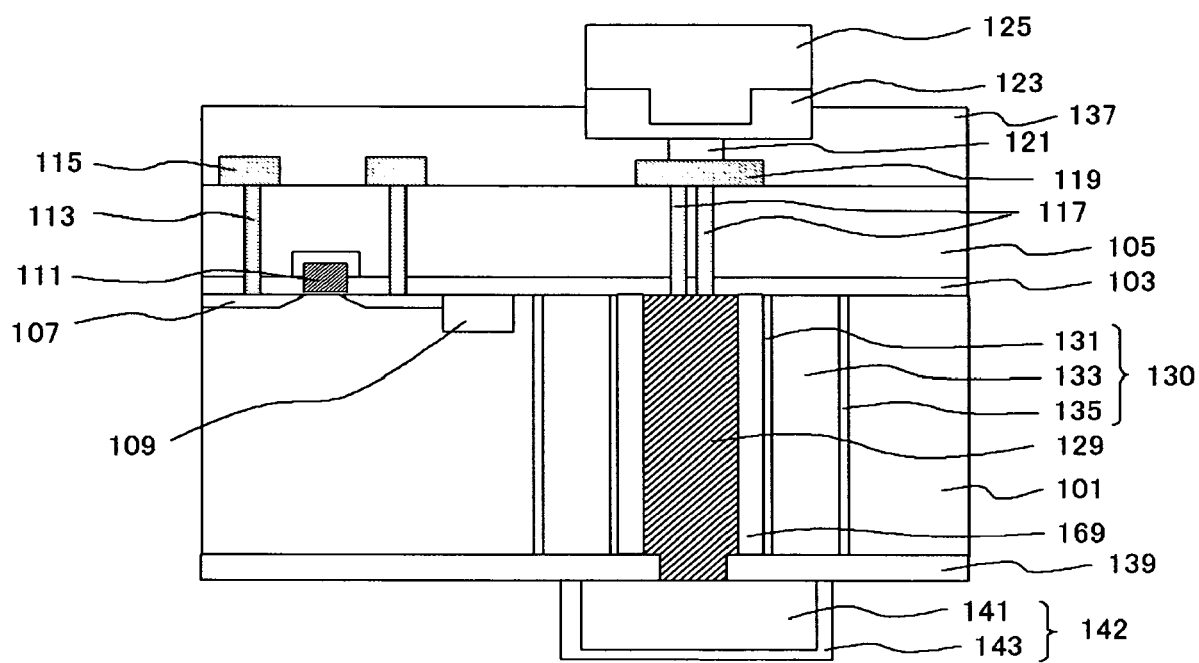
FIG. 5 is a cross-sectional view, illustrating a configuration of a semiconductor device according to an embodiment.

FIG. 5 is a cross-sectional view, illustrating a configuration of a semiconductor device of the present embodiment. Fundamental configuration of the semiconductor device shown in FIG. 5 is similar to the semiconductor device illustrated in FIG. 4, except that the end of the back surface insulating film 139 is not a tapered surface, but a surface parallel to the normal direction to the silicon substrate 101. In addition, in FIG. 5, an annular cylindrical silicon substrate remaining portion 169 is provided in the inside of the first insulating ring 130. Further, the through electrode 129, the silicon substrate remaining portion 169 and the first insulating ring 130 are disposed in this sequence to form a concentric structure.

In the present embodiment, the back surface insulating film 139 protrudes toward the inside of the through electrode 129 beyond the inner surface of the first insulating ring 130, or more specifically protrudes toward the inside of the through electrode 129 beyond the silicon substrate remaining portion 169. Consequently, similar advantageous effects as obtained by employing the configuration of fourth embodiment can also be obtained. In addition, since the silicon substrate remaining portion 169 is provided so as to contact with the entire inner side surface of the first insulating ring 130, the region inside of the first insulating ring 130 can be surely reinforced to more surely inhibit a deterioration of the first insulating ring 130, similarly as in third embodiment.

SIXTH EMBODIMENT

Figure 6:
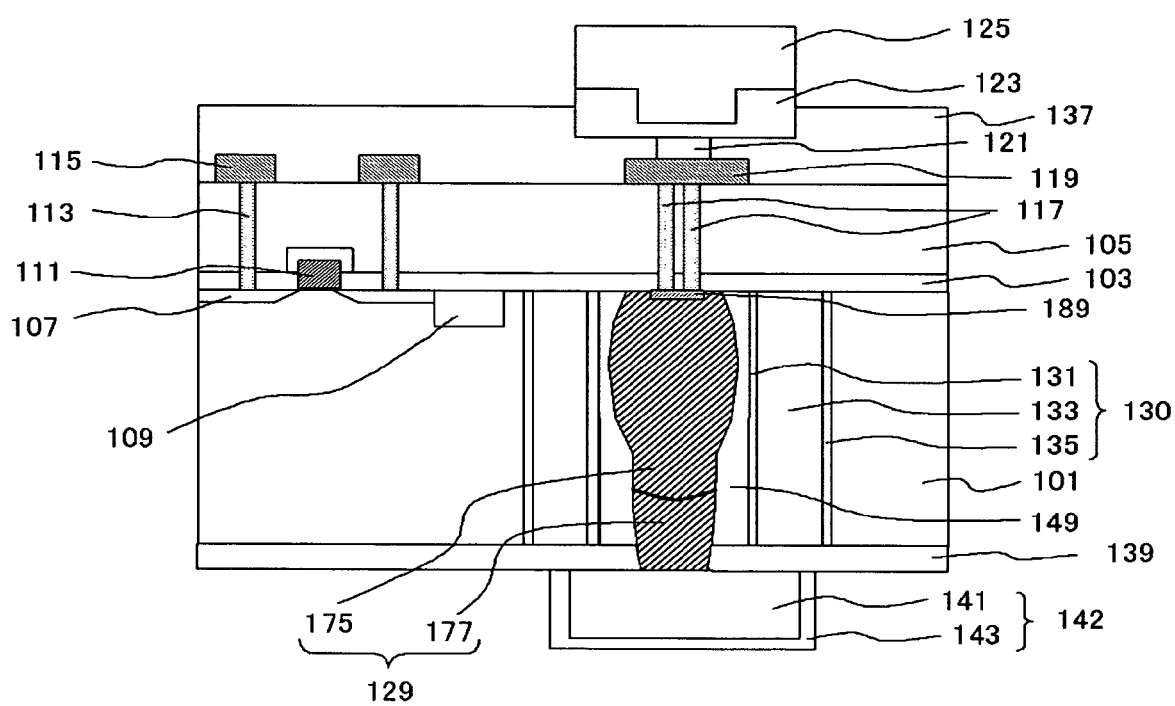
FIG. 6 is a cross-sectional view, illustrating a configuration of a semiconductor device according to an embodiment.

While the exemplary implementation having the through electrode 129 composed of the Cu film is described in the above-mentioned embodiments, the through electrode 129 may alternatively be composed of a multiple-layered member of a plurality of metallic films. FIG. 6 is a cross-sectional view, illustrating a configuration of a semiconductor device of the present embodiment. Fundamental configuration of the semiconductor device shown in FIG. 6 is similar to the semiconductor device illustrated in FIG. 3, except that the through electrode 129 is composed of a nickel (Ni) film 175 and a copper (Cu) film 177, which are stacked from the side of the device-forming surface.

A rate of a growth of the plated film can be increased by utilizing the Ni film 175 as a portion of the through electrode 129, as compared with the case that the whole of the through electrode 129 are presented by the Cu film 177. Consequently, a manufacturing efficiency can be improved.

In addition, since the through electrode 129 in the side of the back surface is composed of the Cu film 177 in the present embodiment, a planarization of the through electrode 129 via a back surface grinding process can be surely conducted.

SEVENTH EMBODIMENT

While the exemplary implementation of having one insulating ring provided in the periphery of the side surface of the through electrode 129 is described in the above-mentioned embodiments, a plurality of insulating ring may alternatively be provided. In addition, a plurality of annular cylindrical insulating film provided in a concentric relationship may be included, and each of a plurality of annular cylindrical insulating films may be separated via members composed of a material that is similar to the material of the semiconductor substrate.

Figure 7:
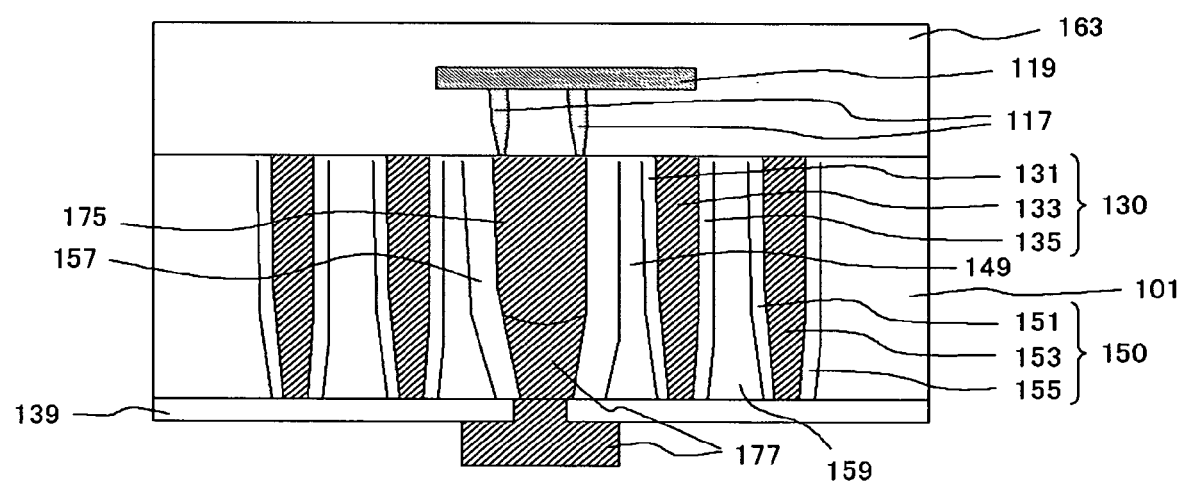
FIG. 7 is a cross-sectional view, illustrating a configuration of a semiconductor device according to an embodiment.
Figure 16:
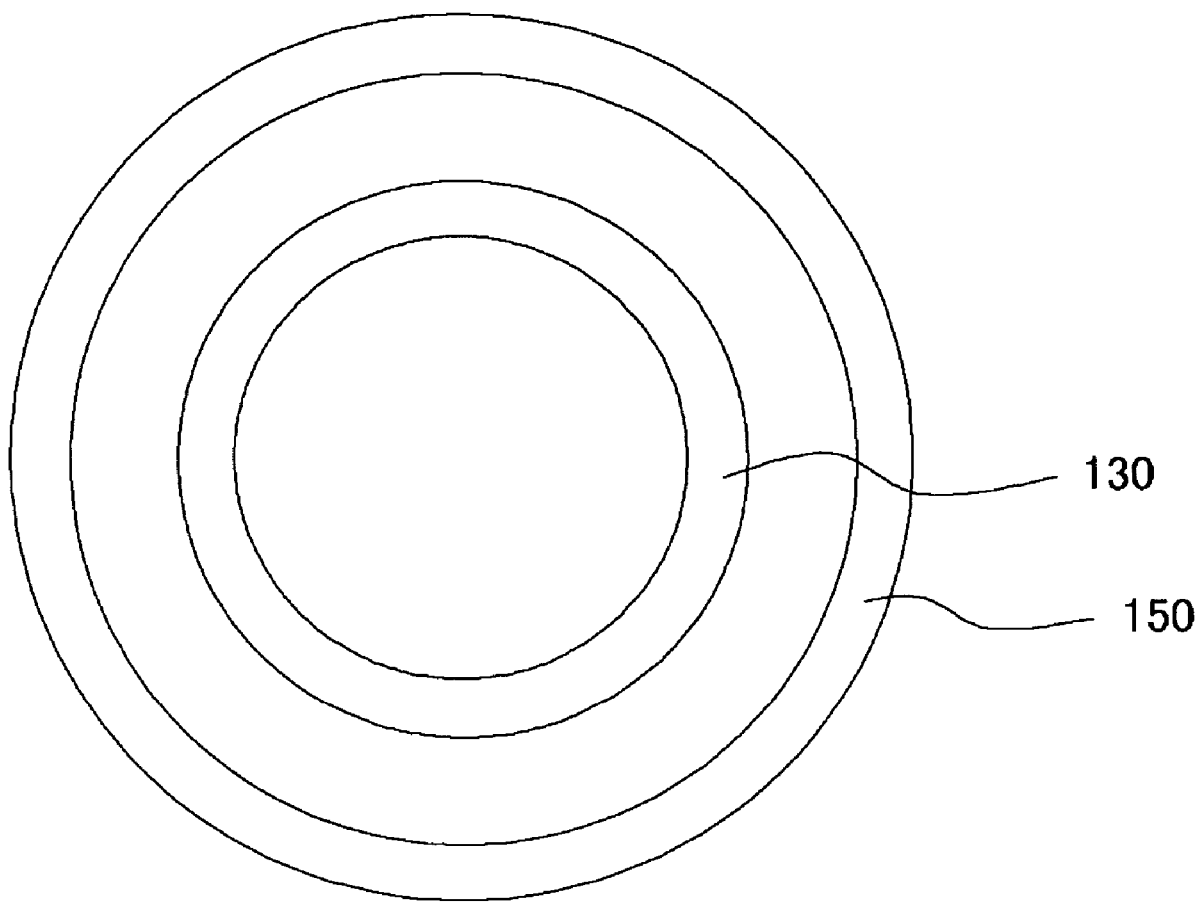
FIG. 16 a plan view, illustrating a configuration of the semiconductor device according to the embodiment.

FIG. 7 is a cross-sectional view, illustrating a configuration of a semiconductor device of the present embodiment. FIG. 16 is a plan view of the semiconductor device shown in FIG. 7. Fundamental configuration of the semiconductor device shown in FIG. 7 and FIG. 16 is similar to the semiconductor device illustrated in FIG. 3, except the following aspects.

First, in the semiconductor device of the present embodiment, a second insulating ring 150 is provided in the outer concentric relationship with the first insulating ring 130. The second insulating ring 150 is composed of annular insulating films, which has an inner diameter that is larger than the outer diameter of the first insulating ring 130, and which includes an SiN film 151, an $SiO_2$ film 153 and an SiN film 155 stacked from the inside of the ring toward the outside in this sequence. A silicon substrate remaining region 159, which is presented by a remained portion of the silicon substrate 101, is also included between the first insulating ring 130 and the second insulating ring 150.

According to the present embodiment, a parasitic capacitance in the vicinity of the through electrode 129 can be more effectively reduced without having larger film thickness of the insulating film of one insulating ring, by providing a plurality of insulating rings. Consequently, the configuration of the present embodiment presents an improved device characteristics and an improved manufacturing stability.

In addition, the through electrode 129 is composed of the Ni film 175 and the Cu film 177 in the present embodiment, similarly as the configuration described in reference to FIG. 6 in sixth embodiment. However, the Cu film 177 is formed from the inside of the aperture of back surface insulating film 139 over the outside thereof in the present embodiment. More specifically, the through electrode 129 and the back surface bump are integrally molded. This can reduce the numbers of steps in the manufacturing process.

In addition, the SiN film 157 that covers the circumference of the side surface of the through electrode 129 is provided in the present embodiment. The SiN film 157 functions as a diffusion barrier film for components contained in the through electrode 129. Consequently, the existence of the SiN film 157 can provide more effective prevention of a diffusion of components contained in the through electrode 129.

In addition to above, in the present embodiment and the following embodiments, the insulating interlayer 163 corresponds to the multi-layered film of the semiconductor device 100 of first embodiment composed of the SiN film 103, the insulating interlayer 105 and the insulating interlayer 137.

EIGHTH EMBODIMENT

While the configurations, in which the first insulating ring 130 is composed of at least three layers of the SiN film 131, the $SiO_2$ film 133 and the SiN film 135, have been exemplified in the above-mentioned embodiments, number of films of the multiple-layered insulating film in the first insulating ring 130 is not particularly limited, a combination of a certain number of certain materials may be employed. The present embodiment illustrates other exemplary implementation of the first insulating ring 130.

Figure 8:
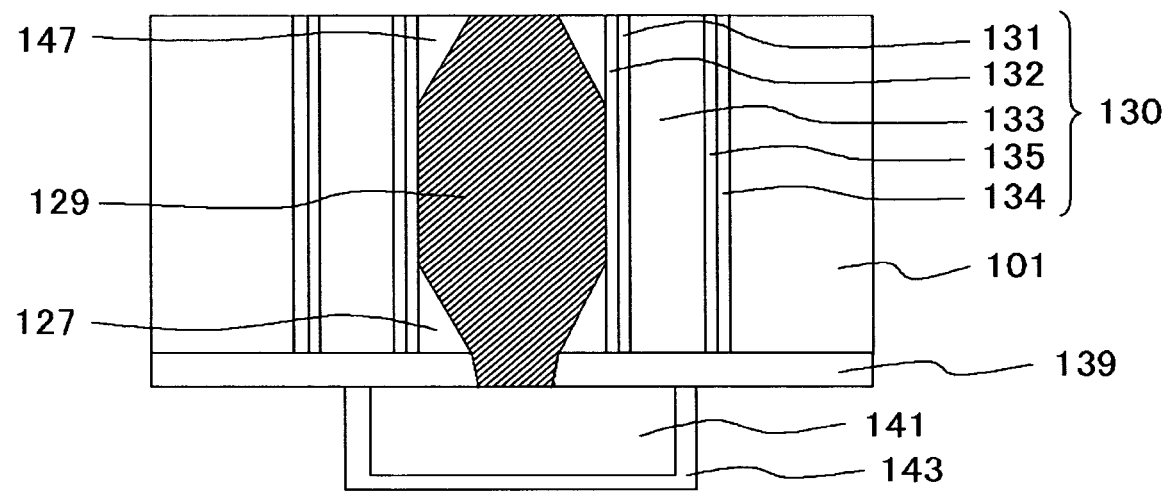
FIG. 8 is a cross-sectional view, illustrating a configuration of a semiconductor device according to an embodiment.

FIG. 8 is a cross-sectional view, illustrating a configuration of a semiconductor device of the present embodiment. Fundamental configuration of the semiconductor device shown in FIG. 8 is similar to the semiconductor device 100 illustrated in FIG. 1, except the structure of the first insulating ring 130. The first insulating ring 130 of FIG. 8 includes a silicon thermal oxide film 132, the SiN film 131, the $SiO_2$ film 133, the SiN film 135 and a silicon thermal oxide film 134, which are sequentially stacked from the inside of the ring. More specifically, the first insulating ring 130 of the present embodiment, is configured to be provided with silicon thermal oxide films outside of the SiN film 131 and outside of the SiN film 135 in the first insulating ring 130 of FIG. 1, respectively. Having such configuration, a dielectric constant of the first insulating ring 130 can be further reduced.

The silicon thermal oxide film 132 and the silicon thermal oxide film 134 may be formed by, for example, forming the cylindrical concave portion as described above in reference to FIG. 9A, and then conducting a thermal oxidation for the surface of the concave portion.

Figure 17:
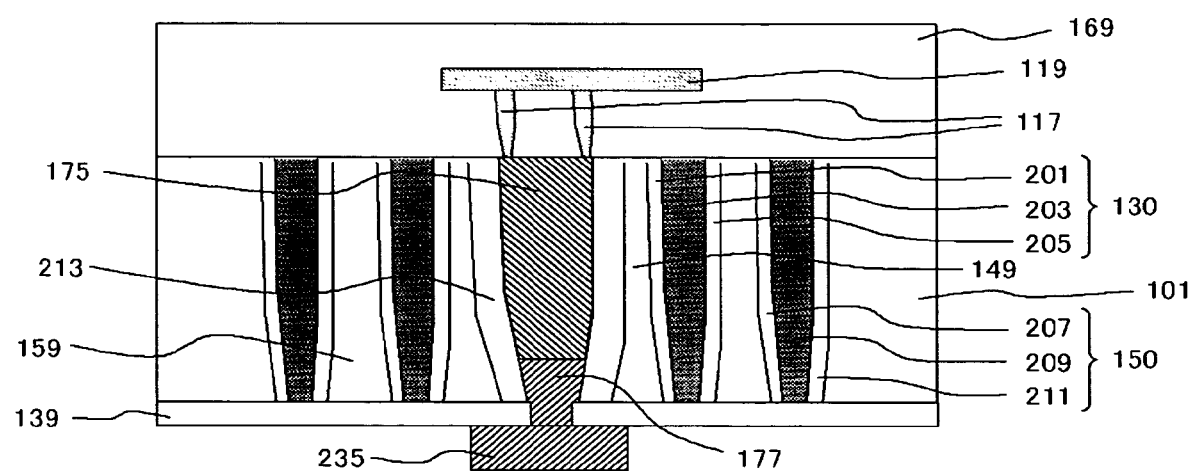
FIG. 17 is a cross-sectional view, illustrating a configuration of a semiconductor device according to an embodiment.
Figure 18:
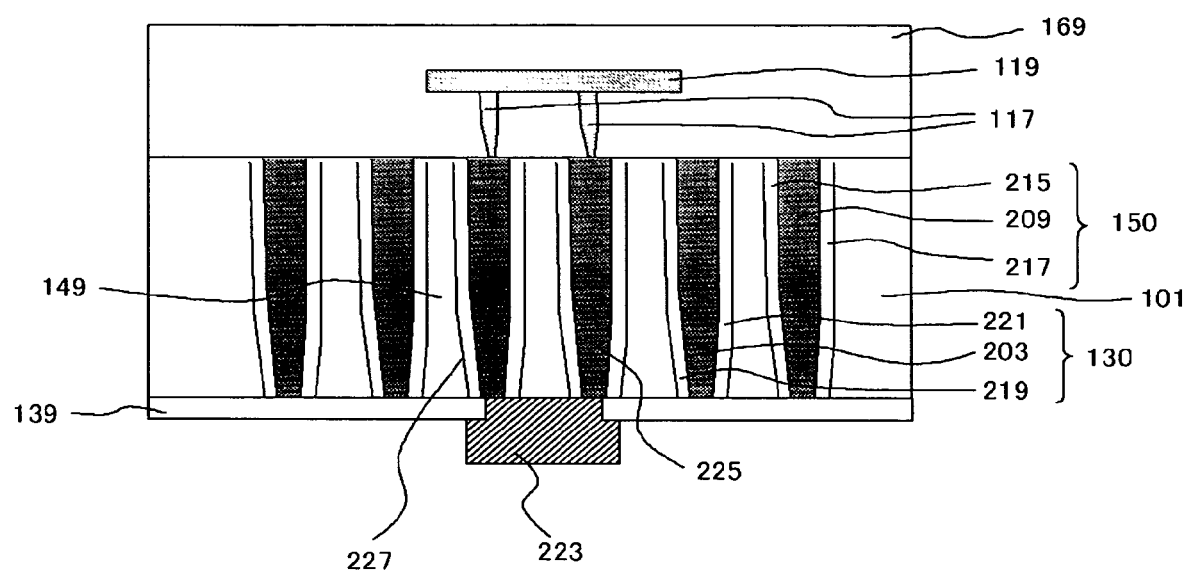
FIG. 18 is a cross-sectional view, illustrating a configuration of a semiconductor device according to an embodiment.
Figure 19:
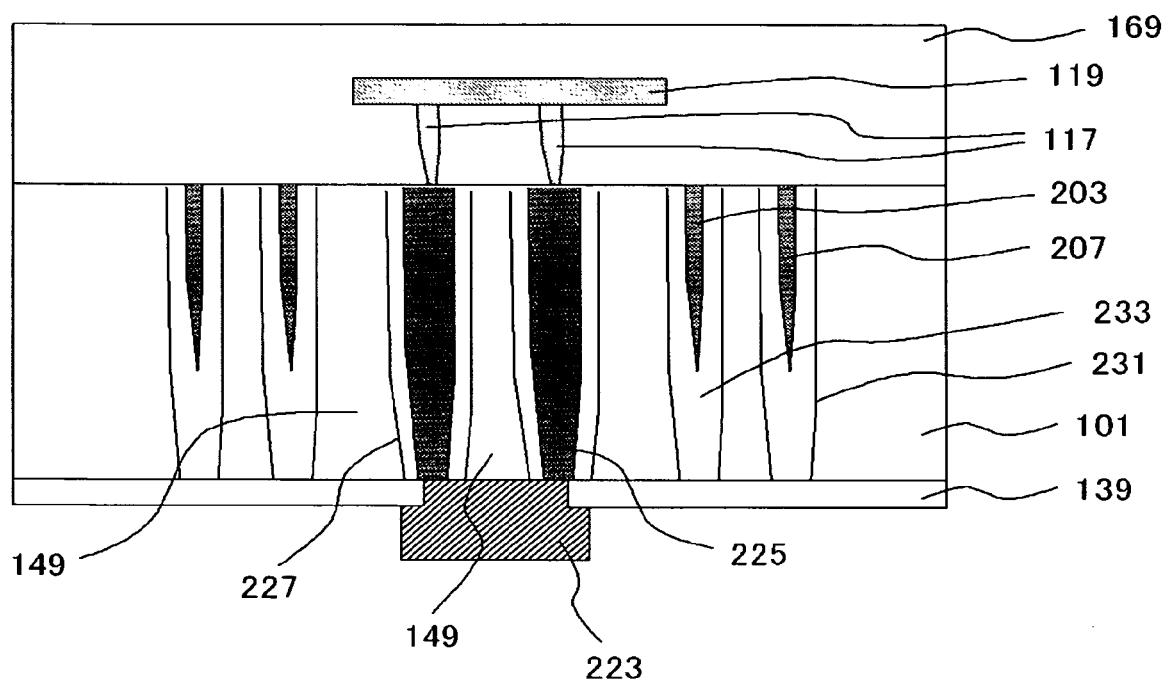
FIG. 19 is a cross-sectional view, illustrating a configuration of a semiconductor device according to an embodiment.

In addition, alternative configurations provided with two insulating rings outside of the through electrode 129 are shown in FIG. 17 to FIG. 19. FIG. 17 to FIG. 19 are cross-sectional views, illustrating the alternative exemplary implementations of the semiconductor devices.

In FIG. 17, the through electrode 129 is composed of the Ni film 175 and the Cu film 177. As a rate of an electroless nickel (Ni) plating process is faster than a rate of an electroless copper (Cu) plating process, the region in the side of the device-forming surface of the through electrode 129 is designed to be composed of the Ni film 175, so that a rate of embedding a metallic film composing the through electrode 129 is increased, thereby providing a further improved manufacturing throughput. In addition to above, in FIG. 17, a Cu/Ti bump 235 serves as the back surface bump.

In addition, in FIG. 17, an $SiO_2/SiN/SiO_2$ film 213 is provided in the circumference of the side surface of the through electrode 129. Consequently, a parasitic capacitance generated between the through electrode 129 and the silicon substrate remaining portion 149 can be further reduced, as compared with the configuration shown in FIG. 7 of the seventh embodiment that is provided with the SiN film 157.

In addition, the device shown in FIG. 17 includes the first insulating ring 130, which has an $SiO_2/SiN/SiO_2$ film 201, a polycrystalline silicon film 203 and an $SiO_2/SiN/SiO_2$ film 205 that are stacked in this sequence from the inside of the annulus toward the outside thereof. Similarly, the device includes the second insulating ring 150, which has an $SiO_2/SiN/SiO_2$ film 207, a polycrystalline silicon film 209 and an $SiO_2/SiN/SiO_2$ film 211 that are stacked in this sequence from the inside of the annulus toward the outside thereof. As such, the polycrystalline silicon film, which serves as an electroconductive film, may be provided in the first insulating ring 130 and the second insulating ring 150. An improved filling capability in the insulating ring can be presented by providing the polycrystalline silicon film.

Figure 20:
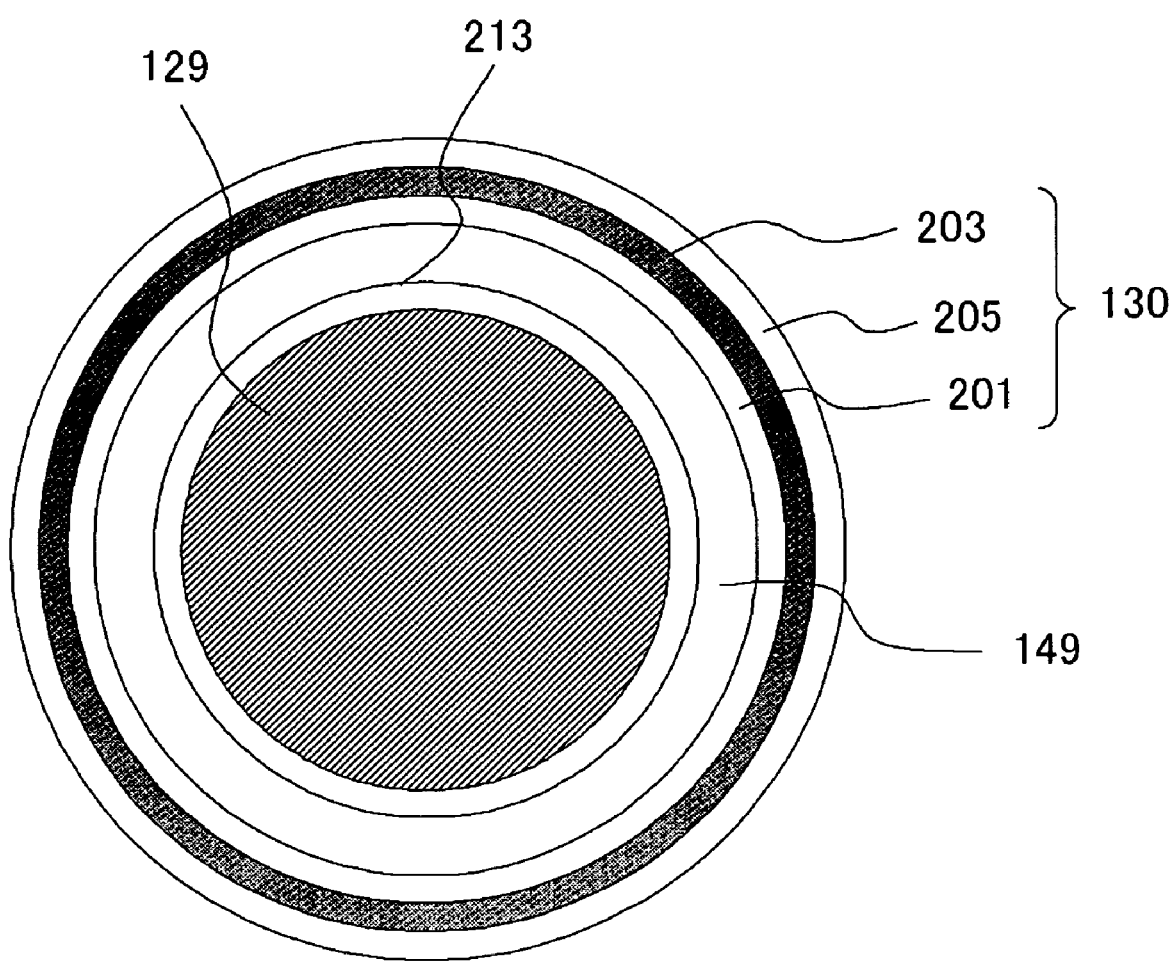
FIG. 20 is a plan view, illustrating the configuration of the semiconductor device according to the embodiment.

In addition to above, concerning FIG. 17, two-dimensional geometries of the through electrode 129 and the first insulating ring 130 may be, for example, configured of the element shown in FIG. 20.

In addition, the through electrode 129 may be composed of a plurality of electrodes extending through the silicon substrate 101. More specifically, a plurality of through electrodes may be provided in the inside of the first insulating ring 130. FIG. 18 and FIG. 19 are cross-sectional views illustrating such configuration.

In FIG. 18, the through electrode 129 is composed of two polycrystalline silicon films 225 in cross sectional view. Side surfaces of the respective polycrystalline silicon films 225 are covered with $SiO_2$ films 227 to provide insulations from the silicon substrate remaining portion 149. The polycrystalline silicon film 225 has a geometry, in which diameter thereof is decreased from the device-forming surface toward the back surface in the vicinity of the back surface of the silicon substrate 101.

In addition, the first insulating ring 130 is composed of an $SiO_2$ film 219, the polycrystalline silicon film 203 and an $SiO_2$ film 221 that are stacked in this sequence from the inside of the annulus toward the outside thereof. Further, the second insulating ring 150 is composed of an $SiO_2$ film 215, the polycrystalline silicon film 209 and the $SiO_2$ film 217 that are stacked in this sequence from the inside of the annulus toward the outside thereof.

In FIG. 18, in one side of each of the polycrystalline silicon films 225, the back surface insulating film 139 and the $SiO_2$ film 227 projects to a side of the polycrystalline silicon film 225. In this case, a falling off of the polycrystalline silicon film 225 can also be inhibited. Further, in FIG. 18, the silicon substrate remaining portion 149 exists to fill the spaces between a plurality of polycrystalline silicon films 225. The silicon substrate remaining portion 149 has a tapered portion, which gradually broadens from the device-forming surface of the silicon substrate 101 toward the back surface thereof. A Cu/Ti/Al bump 223 that serves as a back surface bump contacts with the silicon substrate remaining portion 149, and also contacts with a plurality of polycrystalline silicon films 225. Consequently, the region between the polycrystalline silicon films 225 are reinforced by the silicon substrate remaining portion 149 and the Cu/Ti/Al bump 223.

Further, polycrystalline silicon is selected as the material for the through electrode 129, so that simultaneous formation of the first insulating ring 130 and the second insulating ring 150 can be achieved. Further, an aluminum (Al) film may be employed in the side of the silicon substrate 101 of the back surface bump to provide an improved ohmic property with the polycrystalline silicon film 129.

Fundamental configuration of the semiconductor device shown in FIG. 19 is similar to the semiconductor device illustrated in FIG. 18, except that the $SiO_2$ film 219 is not isolated from the $SiO_2$ film 221 in the side of the back surface of the silicon substrate 101, and instead, a continuous and integral $SiO_2$ film 233 is provided. Similarly, a continuous and integral $SiO_2$ film 231 is provided, in place of the $SiO_2$ film 215 and the $SiO_2$ film 217. While polycrystalline silicon is employed for the material composing the first insulating ring 130 and the second insulating ring 150 in the device of FIG. 19, narrower bodies may alternatively be employed for these insulating rings, and only one layer, which is not to be filled with an insulating film ($SiO_2$ film), may be filled with a polycrystalline silicon film, as an electro conductivity is not required for the ring. This alternative configuration provides narrower intervals between the through electrodes 129.

Further, similarly as in the device shown in FIG. 18, a plurality of polycrystalline silicon electrodes are employed, in place of employing the single through electrode 129 in the device shown in FIG. 19, so that an improvement in the filling capability of the through electrode and a reduced resistance can be simultaneously achieved.

Figure 21:
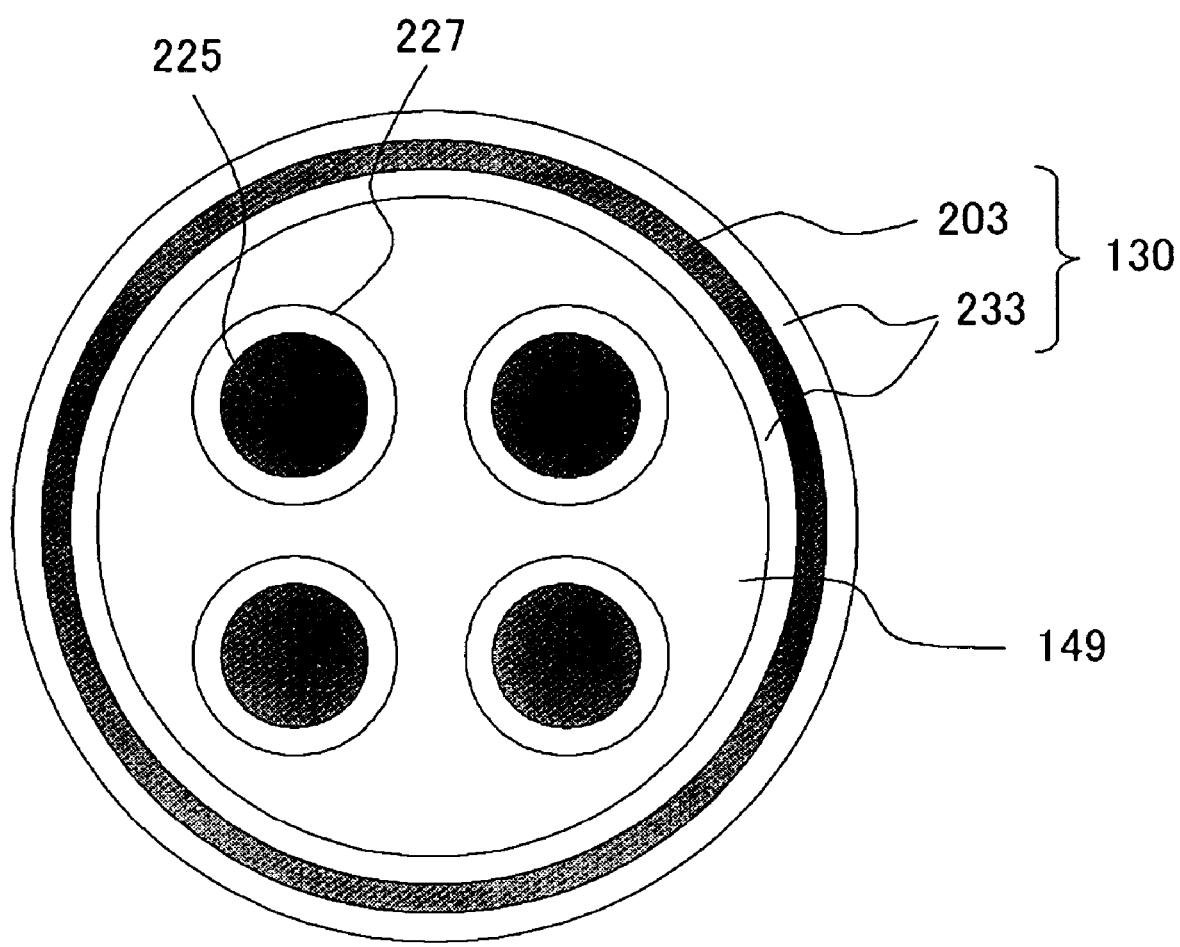
FIG. 21 is a plan view, illustrating a configuration of a semiconductor device according to the embodiment.

In addition to above, concerning FIG. 19, two-dimensional geometries of the through electrode 129 and the first insulating ring 130 may be, for example, configured of elements shown in FIG. 21. As shown in FIG. 21, in place of the through electrode 129, four independent electrodes composed of the polycrystalline silicon film 225, for example, may be employed.

Further, in the above-described embodiments, a barrier film for preventing a diffusion of a metal can be provided in a predetermined location. The barrier film may be an insulating film or may be an electroconductive film. Typical insulating film may be a film containing nitrogen such as an SiN film or an SiCN film, and typical electroconductive film may be a film, which can be utilized for composing the interconnect metal such as a barrier metal film and the like.

Figure 24:
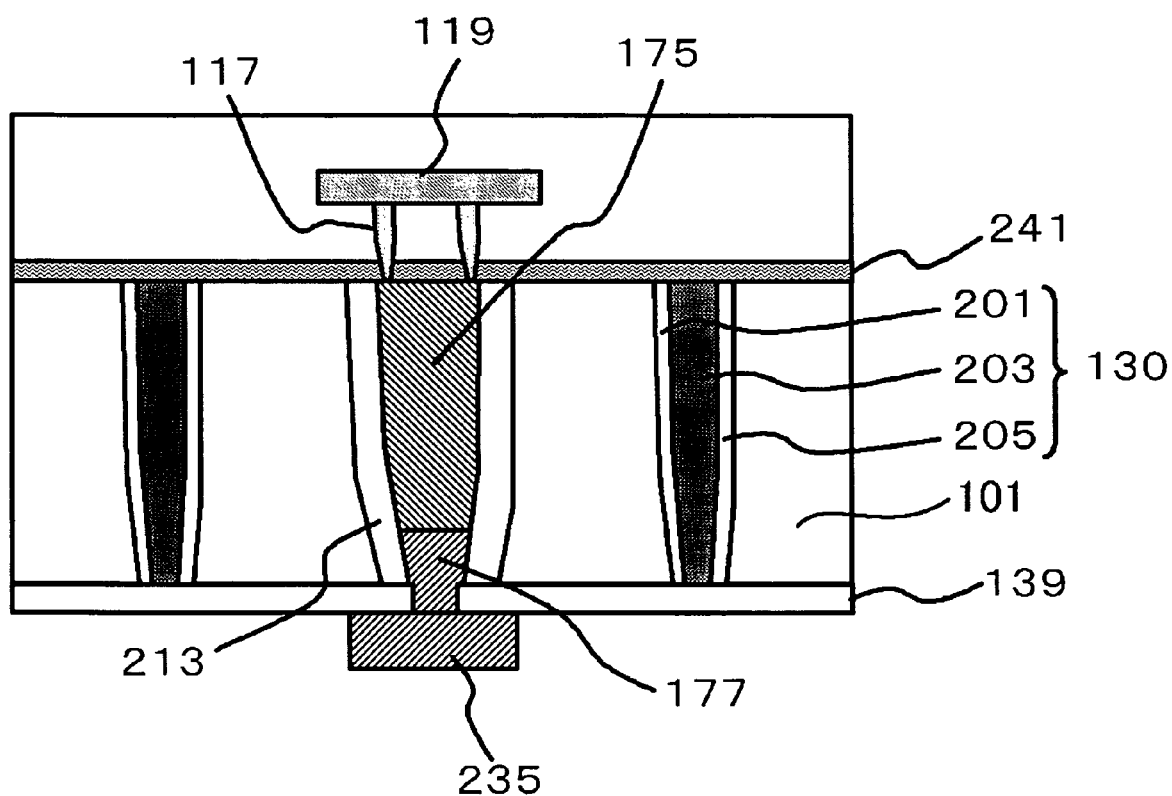
FIG. 24 is a cross-sectional view, illustrating a configuration of a semiconductor device according to the embodiment.
Figure 25:
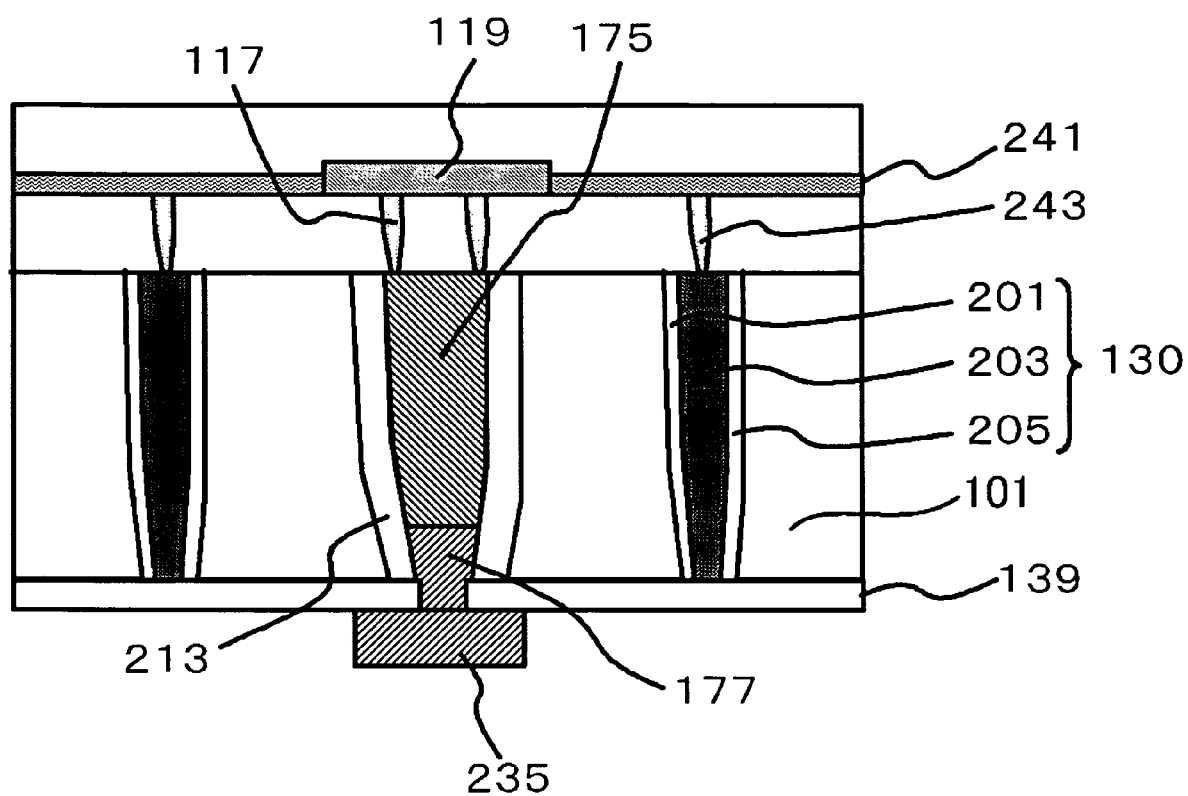
FIG. 25 is a cross-sectional view, illustrating a configuration of a semiconductor device according to the embodiment.
Figure 26:
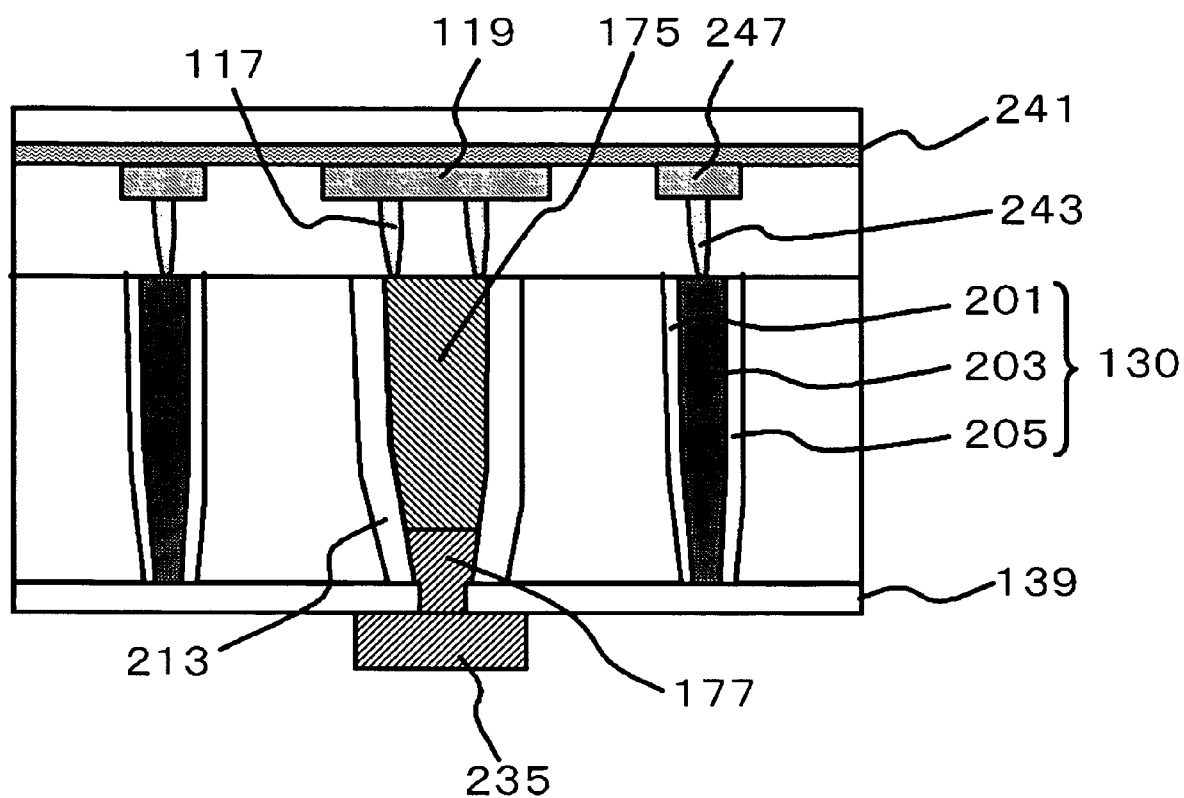
FIG. 26 is a cross-sectional view, illustrating a configuration of a semiconductor device according to the embodiment.

FIG. 24 to FIG. 26 are cross-sectional views, illustrating an arrangement constitution of the barrier film.

Fundamental configuration of the semiconductor device shown in FIG. 24 is similar to the semiconductor device illustrated in FIG. 17, except that the device does not include the second insulating ring 150 but includes an SiN film 241.

The barrier film is formed at least within the inside of the first insulating ring 130 and in the side of the device-forming surface and in the side of the back surface of silicon substrate 101. This barrier film is composed of an SiN film provided in the side of the device and an SiN film provided in the side of the back surface serving as a back surface insulating film 139.

Further, a predetermined region of the silicon substrate 101 is removed, and the predetermined removed region is provided with a first insulating ring 130 and a through electrode 129, and a region formed of a remained portion of the silicon substrate 101 is provided between a region for forming the annular cylindrical insulating film 130 and a region for forming the through electrode 129, and the device-forming surface side in the region of the through electrode 129, the region of the first insulating ring 130 and the region where the silicon substrate are remained are covered with a barrier film for preventing a diffusion of a metal. Further, a barrier film covers the device-forming surface side and the back surface side of the silicon substrate 101 from the region for forming the through electrode 129 over the region for forming the first insulating ring 130.

Since the portion for forming the transistor is isolated by the barrier film according to the above-described configuration, a deterioration in the device performance can be prevented, even if a contamination of metal is occurred when the etching of silicon is conducted from the back surface thereof or when the inside of the through hole is filled with metal.

Further, the first insulating ring 130 is provided in the circumference of the side surface of the through electrode 129, which is composed of an Ni film 175 and a Cu film 177, and extends through the silicon substrate 101, and includes at least single layer of barrier film, which is capable of preventing a diffusion of a metal. This barrier film is an SiN film, which is a part of a combined film: $SiO_2/SiN/SiO_2$ film 201 and a part of a combined film: $SiO_2/SiN/SiO_2$ film 205.

In FIG. 25, a semiconductor element (not shown) and an electroconductive contact plug (not shown) coupled to the semiconductor element are provided on the device-forming surface of the silicon substrate 101. The contact plug coupled to the semiconductor element is provided in the same level as the through electrode connecting plug 117. Further, the configuration in FIG. 25 shows that, above the side of the device surface of the annular cylindrical insulating film, a ring-shaped contact interconnect (seal ring 243) is provided in the same level as the contact plug. The seal ring 243 is provided in the same layer that also includes the through electrode connecting plug 117 and the contact plug coupling to the semiconductor element, and is formed simultaneously with forming these plugs.

The configuration shown in FIG. 25 has, more specifically, substantially the same configuration as the configuration FIG. 24 has, except that a ring interconnect (seal ring 243) of tungsten, which is formed simultaneously with forming the contact plug, is formed on the first insulating ring 130. The seal ring 243 is provided so as to contact with the upper portion of the first insulating ring 130, and is composed of, for example, a tungsten film.

Further, the SiN film 241 functioning as a barrier film is formed on the seal ring 243. In this case, the SiN film 241 is formed immediately above the seal ring 243. The SiN film 241 is provided so as to contact with the upper portion of contact plug coupling to the semiconductor device and the upper portion of the seal ring 243. The SiN film 241 is provided in the entire interior of the region for forming the seal ring 243 to cover the upper portion of the insulating interlayer that includes the seal ring 243 and the contact plug embedded therein. More specifically, the upper portions of the through electrode 129, the combined film $SiO_2/SiN/SiO_2$ 213 and the combined film $SiO_2/SiN/SiO_2$ 201 and at least a portion of the upper portion of the polycrystalline silicon film 203 are covered with the SiN film 241.

In such a configuration, the portion for forming the transistor is isolated from the through electrode by the presence of the barrier film, the interconnect metal and the polysilicon film, so that a concern of being contaminated with metal can be avoided. In such configuration, an issue of a metal contamination is not caused by the presence of the tungsten ring and the barrier film, even if the silicon is over etched to etch an interconnect interlayer film in the side of the device surface, when the silicon is etched from the back surface thereof.

The configuration in FIG. 26 shows that a ring of another metallic interconnect is provided immediately above of the ring interconnect composed of tungsten shown in FIG. 25.

In FIG. 26, a ring-shaped metallic interconnect (ring-shaped interconnect 247) is further provided so as to contact the upper portion of the seal ring 243. Further, a barrier film (SiN film 241) for preventing a diffusion of metal is provided so as to contact with the upper portion of the ring-shaped interconnect 247.

In addition to above, when Cu is employed for a metallic interconnect such as the seal ring 243, the ring-shaped interconnect 247 and the like or a through electrode connecting plug 117 in the configurations shown in FIG. 24 to FIG. 26, a metallic barrier film such as tantalum (Ta), tantalum nitride (TaN), tungsten nitride (WN), titanium nitride (TiN) or the like is be formed, prior to forming Cu. Further, an insulating barrier film is formed on the Cu interconnect. A material such as SiN, SiCN and the like may be employed for the insulating barrier film. The configuration including the Cu interconnect and the W plug, and the barrier film on the Cu interconnect is a general configuration for a large scale integrated circuit (LSI) that employs a damascene Cu interconnect, and an issue of causing a metal contamination resulted from the formation of the through electrode can be avoided, without introducing an additional process.

Figure 28:
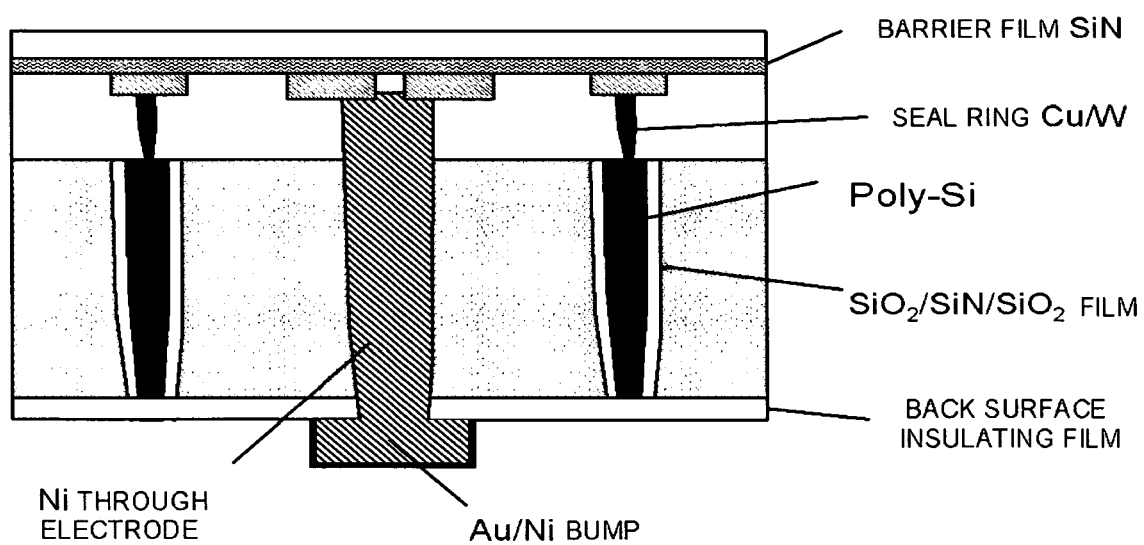
FIG. 28 is a cross-sectional view, illustrating a configuration of a semiconductor device according to the embodiment.
Figure 29:
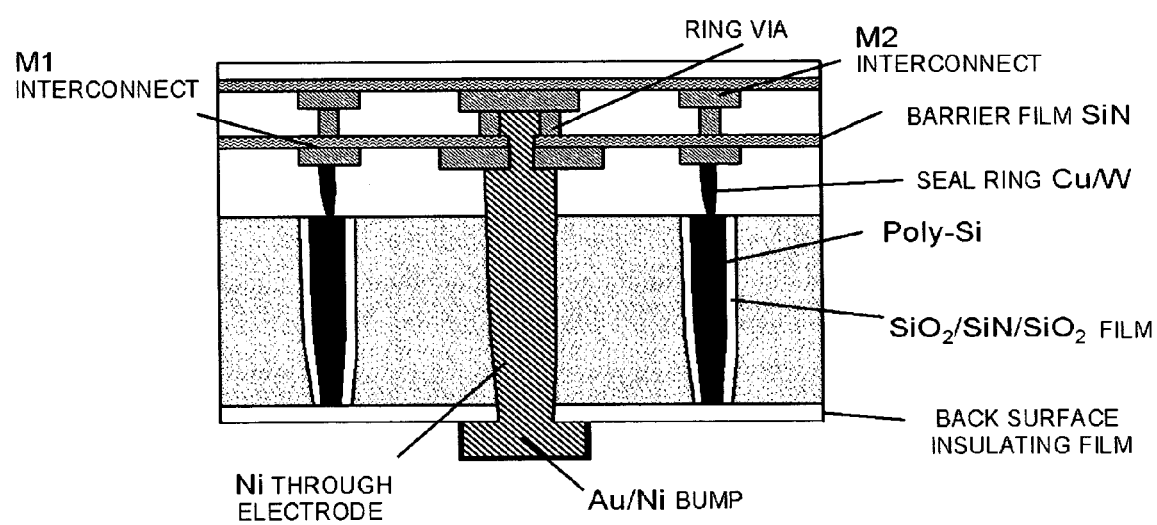
FIG. 29 is a cross-sectional view, illustrating a configuration of a semiconductor device according to the embodiment.

FIG. 28 and FIG. 29 are cross-sectional views, illustrating yet other example of a semiconductor device. A configuration in FIG. 28 shows that the through electrode shown in FIG. 26 is directly connected to an interconnect of a LSI. In FIG. 28, the through electrode is formed to penetrate through the Si substrate from the back surface thereof, and eventually be coupled to an underlying interconnect of the LSI. Such through electrode is mainly prepared via a nickel (Ni) electroless plating process, and further a gold (Au) plating process is conducted, and eventually formed to be an integrated with a back surface bump.

The LSI interconnect connectd to the through electrode may be in a form of either a single interconnect, or a multiple interconnects. When the coupling is made to multiple interconnects, a necessary linewidth of a single interconnect in the multiple interconnects can be reduced, thereby providing an improved consistency with the LSI interconnect process. Further, while the side wall of the through electrode is in contact directly with Si, an electrical insulation is ensured by the annular cylindrical insulating film. While Ni is employed for the material of the through electrode in this embodiment, any electrically conductive materials, which is inert with Si, may also be employed. For example, after the through hole is formed, an electroconductive paste may be embedded therein to form an through electrode.

FIG. 29 illustrates an exemplary implementation, in which the through electrode shown in FIG. 28 penetrates through an insulating film between M1 underlying interconnects and reaches to a M2 interconnect. When the multiple interconnects are employed for the M1 interconnect coupled to the through electrode, an insulating film between the interconnects may be possibly dropped off therefrom during an etch process, and a contamination of a metal due to such dropping off can be prevented by disposing the M2 interconnect and a ring via surrounding such region. It may be further preferable that the M2 ring interconnect and the ring via are formed immediately above the M1 ring interconnect.

Figure 22:
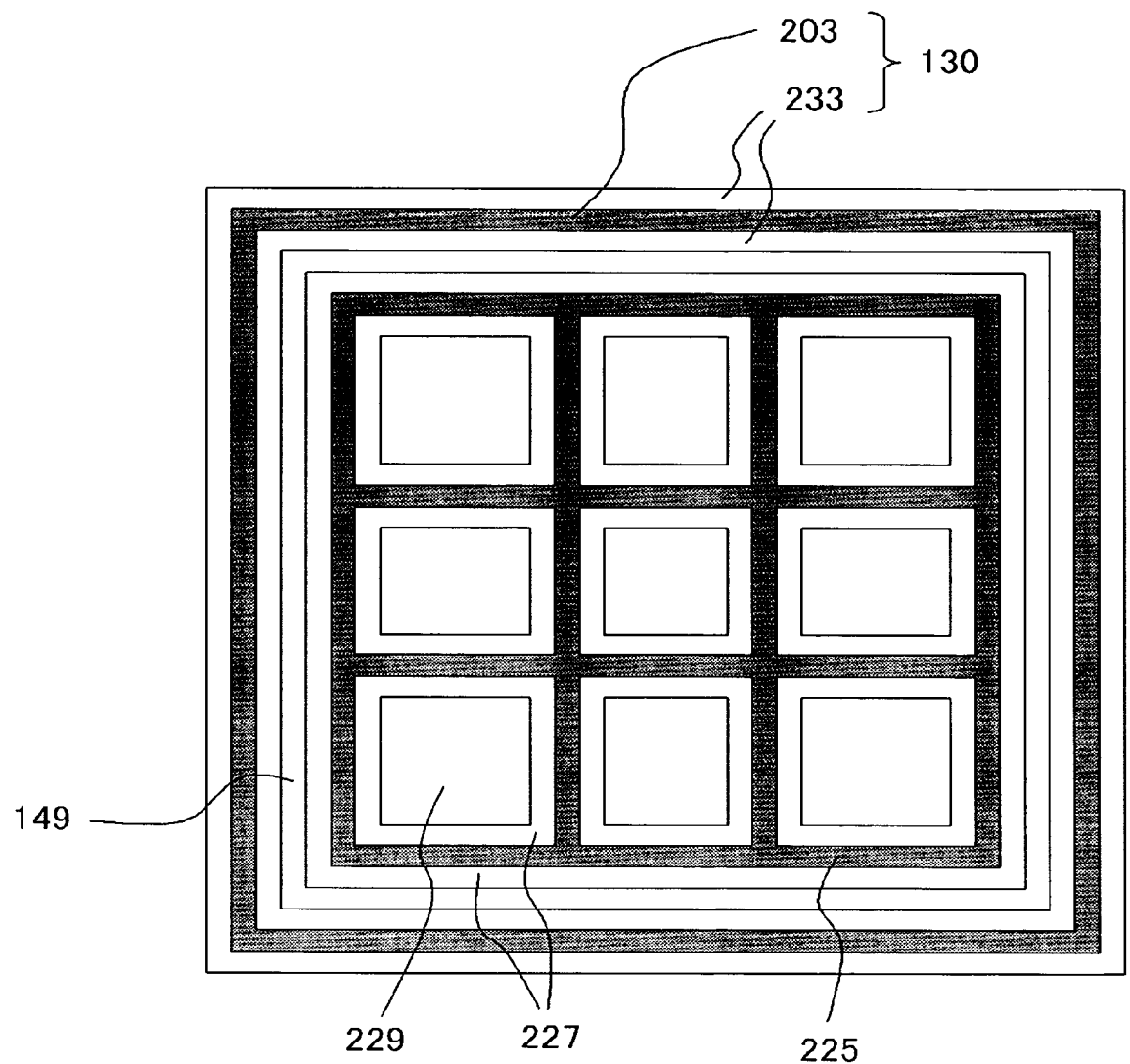
FIG. 22 is a plan view, illustrating a configuration of a semiconductor device according to the embodiment.
Figure 23:
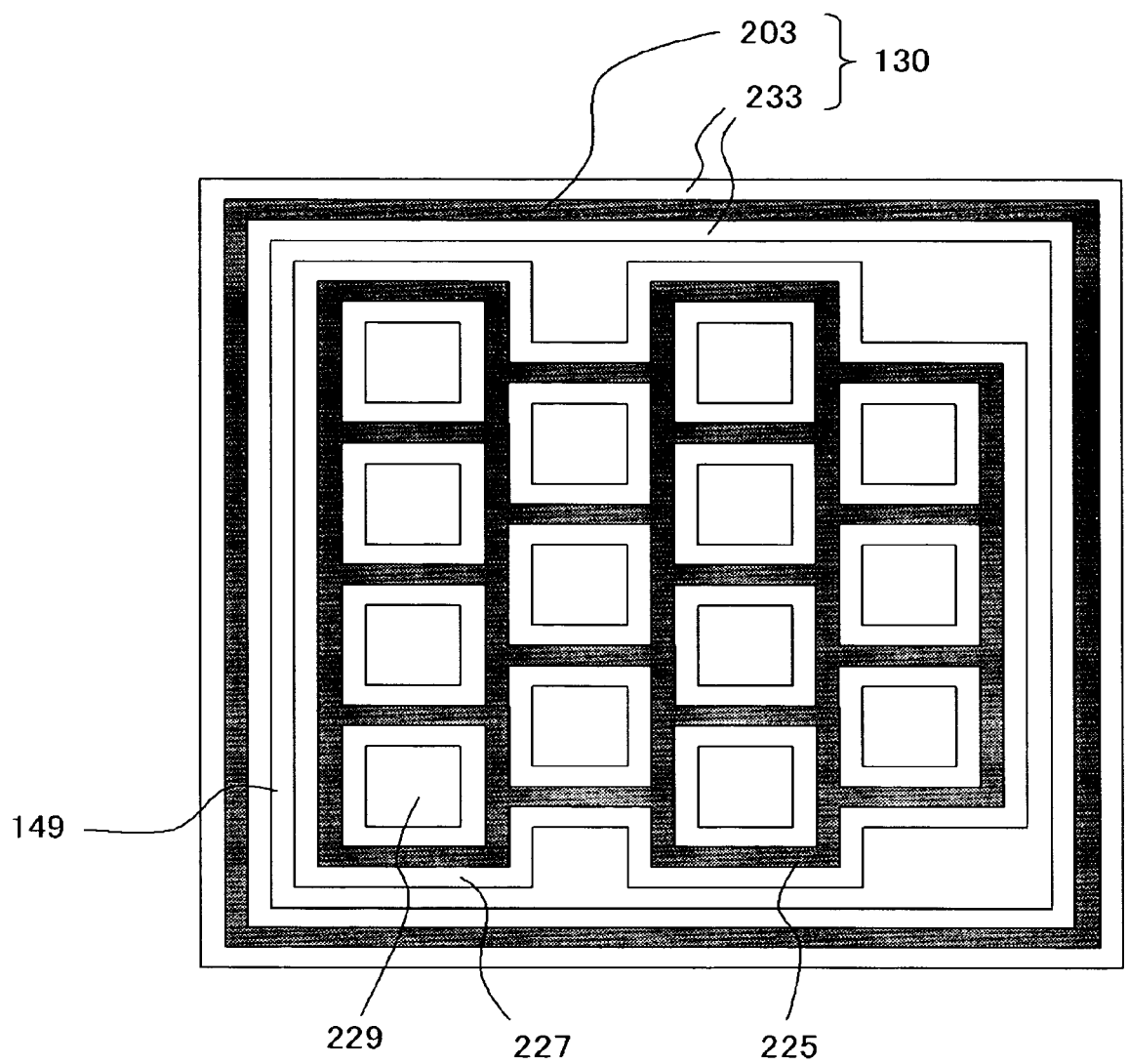
FIG. 23 is a plan view, illustrating a configuration of a semiconductor device according to the embodiment.
Figure 27:
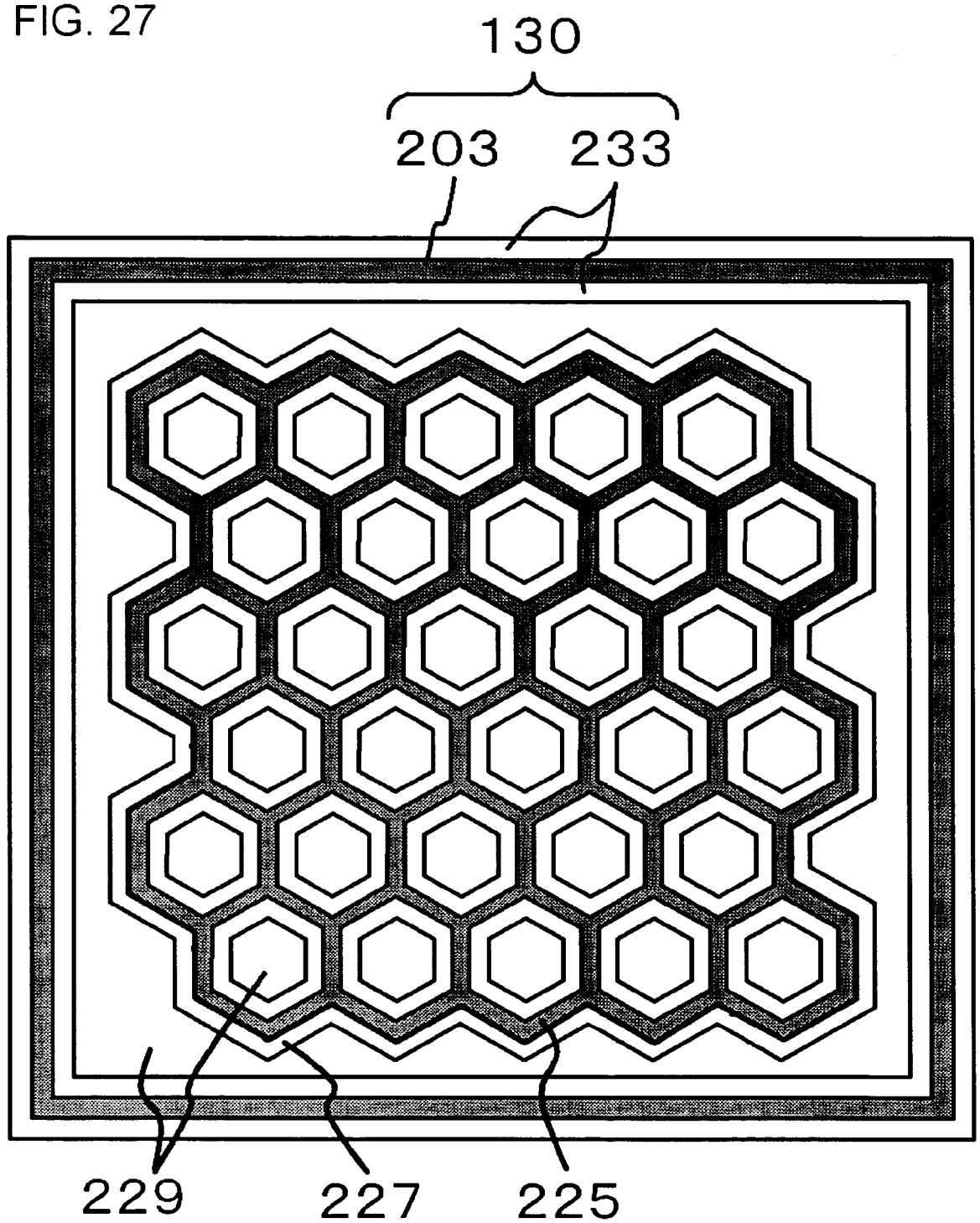
FIG. 27 is a plan view, illustrating a configuration of a semiconductor device according to the embodiment.

Alternatively, in place of the through electrode 129, a stripe-patterned polycrystalline silicon film may alternatively be employed. FIG. 22, FIG. 23 and FIG. 27 are plan views illustrating such configurations.

In FIG. 22, the through electrode is composed of one continuous and integral polycrystalline silicon film 225. The polycrystalline silicon film 225 is composed of a loop region and connecting regions for connecting two different portions of the annulus. In FIG. 22, a two-dimensional geometry of the annular region is a square, and the regions for connecting the annulus to form double cross pattern are provided. Further, silicon substrate remaining portions 229 are included in the inside of the connecting region. A two-dimensional geometry of the silicon substrate remaining portion 229 is also a square. Side surfaces of the polycrystalline silicon films 225 are coated with the $SiO_2$ films 227. Further, side surfaces of the silicon substrate remaining portions 229 are also coated with the $SiO_2$ films 227. More specifically, the silicon substrate remaining portion 229 is insulated from the polycrystalline silicon film 225 via the $SiO_2$ film 227. Here, the term "annular" further contains a square or a rectangular loop, in addition to a circular loop.

According to the configuration of the device shown in FIG. 22, the region for forming the polycrystalline silicon film 225 is made slit-like, so that the filling capability therein can be improved.

Alternatively, the configuration of the device shown in FIG. 23 includes the configuration of the device shown in FIG. 22, except that crisscross intersections in the connecting region does not exist, and the silicon substrate remaining portion 229 is patterned to form a diagonal lattice pattern. In the device shown in FIG. 23, the polycrystalline silicon film 225 is only composed of slit-shaped regions and T-shaped intersections. Consequently, filling capability within the polycrystalline silicon film 225 can be further improved. In addition, since the etching is easily proceeded at intersections of the slit, the width of the etched trench is increased, and therefore voids may be easily generated after the filling process. On the contrary, according to the configuration of FIG. 23, a generation of such voids can be inhibited.

FIG. 27 is a diagram, illustrating a configuration of a hexagonal silicon substrate remaining portion 229. In FIG. 27, intersections of slits in polycrystalline silicon film 225 are provided to form an intersecting angle, which is larger than the intersecting angle of the above-described T-shaped intersection. Consequently, etch uniformity around the intersection can be further improved, and therefore a filling capability for the polycrystalline silicon film 225 can be further improved.

Preferable embodiments of the present invention have been described. It should be understood that it is not intended to limit the scope of the present invention to these embodiments described above, and it is obvious for a person having ordinary skills in the art that the embodiments described above may be modified without departing from the scope of the present invention.

For example, while the configuration that the through electrode 129 contacts with the through electrode connecting plug 117 at their end surfaces is exemplified in the above embodiments, the end of the through electrode connecting plug 117 may alternatively be buried within the through electrode 129. This can ensure further close contact between the through electrode 129 and the through electrode connecting plug 117 via an anchor effect, thereby providing a further effective prevention from a falling off of the through electrode 129. In addition, this can provide an increased contact area between the through electrode 129 and the through electrode connecting plug 117, thereby providing further reduced contact resistance therebetween.

In addition, while the cohesive agent layer 179 and the support 181 are stripped from the device-forming surface of the silicon substrate 101 in the above embodiments, these may be served as a portion of the semiconductor device without stripping from the device-forming surface of the silicon substrate 101 as required.

It is apparent that the present invention is not limited to the above embodiment, that may be modified and changed without departing from the scope and spirit of the invention.

What is claimed is:

1. A semiconductor device, comprising:
   a semiconductor substrate;
   a through electrode extending through said semiconductor substrate;
   an annular cylindrical insulating film, being provided in a circumference of a side surface of said through electrode and extending through said semiconductor substrate; and
   a protruding portion provided separately from said through electrode and provided separately from said annular cylindrical insulating film at least in the vicinity of a back surface of a device-forming surface of said semiconductor substrate so as to contact with said through electrode, and protruding in a direction along the surface of said semiconductor substrate toward an interior of said through electrode and protruding concentrically through said semiconductor substrate, said protruding portion not completely covering the back surface of said through electrode and extending only partially through the substrate.

2. The semiconductor device according to claim 1, wherein at least a portion of said protruding portion is composed of an insulating material.

3. The semiconductor device according to claim 2, further comprising a back surface insulating film provided so as to contract with said back surface, wherein said back surface insulating film composes at least a portion of said protruding portion.

4. The semiconductor device according to claim 1, wherein a predetermined region of said semiconductor substrate is removed and said removed predetermined region is provided with said annular cylindrical insulating film and said through electrode, and a region formed of a remained portion of said semiconductor substrate is provided between a region for forming said annular cylindrical insulating film and a region for forming said through electrode.

5. The semiconductor device according to claim 4, wherein at least a portion of said protruding portion is composed of a region formed of a remained portion of said semiconductor substrate.

6. The semiconductor device according to claim 5, wherein said region formed of the remained portion of said semiconductor substrate is provided so as to surround the entire interior side surface of said annular cylindrical insulating film.

7. The semiconductor device according to claim 1, wherein said annular cylindrical insulating film includes a plurality of insulating films deposited to form a concentric cylinder.

8. The semiconductor device according to claim 1, wherein said through electrode has a diameter decreasing toward said device-forming surface, in the vicinity of said device-forming surface.

9. The semiconductor device according to claim 1, wherein said through electrode has a diameter increasing toward said device-forming surface, in the vicinity of said back surface.

10. The semiconductor device according to claim 1, wherein a plurality of said through electrode are provided in the interior of said annular cylindrical insulating film.

11. The semiconductor device according to claim 1, further comprising an annular cylindrical insulating film, being provided in a circumference of a side surface of said through electrode, extending through said semiconductor substrate, and containing at least single layer of a barrier film that is capable of preventing a diffusion a metal.

12. The semiconductor device according to claim 11,
wherein a predetermined region of said semiconductor substrate is removed and said removed predetermined region is provided with said annular cylindrical insulating film and said through electrode, and a region formed of a remained portion of said semiconductor substrate is provided between a region for forming said annular cylindrical insulating film and a region for forming said through electrode, and wherein a region formed of remained portions of said through electrode, said annular cylindrical insulating film and said semiconductor substrate in the side of the device-forming surface are covered with a barrier film that prevents a diffusion of metal.

13. The semiconductor device according to claim 11, wherein
a semiconductor device and an electroconductive contact plug coupled to said semiconductor device are provided on the device-forming surface of said semiconductor substrate, and a ring-shaped contact interconnect is provided above the side of the device surface of said annular cylindrical insulating film so as to be located in the same level as said contact plug.

14. The semiconductor device according to claim 13, wherein a barrier film that prevents a diffusion of metal is provided so as to contact with an upper portion of said contact plug and an upper portion of said ring-shaped contact interconnect.

15. The semiconductor device according to claim 13, wherein a ring-shaped metallic interconnect is further provided so as to contact with the upper portion of said ring-shaped contact interconnect.

16. The semiconductor device according to claim 15, wherein a barrier film that prevents a diffusion of metal is provided so as to contact with the upper portion of said ring-shaped metallic interconnect.

17. A semiconductor device, comprising:
a semiconductor substrate;
a through electrode extending through said semiconductor substrate;
an annular cylindrical insulating film, being provided in a circumference of a side surface of said through electrode and extending through said semiconductor substrate; and
a protruding portion provided on at least in the vicinity of a back surface of a device-forming surface of said semiconductor substrate so as to contact with said through electrode and protruding in a direction along the surface of said semiconductor substrate toward an interior of said through electrode,
wherein a predetermined region of said semiconductor substrate is removed and a portion of said removed predetermined region is provided with said annular cylindrical insulating film and said through electrode, and a region formed of a remained portion of said semiconductor substrate is provided between a region for forming said annular cylindrical insulating film and a region for forming said through electrode.

18. The semiconductor device according to claim 17, wherein at least a portion of said protruding portion is composed of a region formed of a remained portion of said semiconductor substrate.

* * * * *